(12) United States Patent
Chambers et al.

(10) Patent No.: US 7,642,146 B2
(45) Date of Patent: ***Jan. 5, 2010

(54) SEMICONDUCTOR CMOS DEVICES AND METHODS WITH NMOS HIGH-K DIELECTRIC PRESENT IN CORE REGION THAT MITIGATE DAMAGE TO DIELECTRIC MATERIALS

(75) Inventors: James Joseph Chambers, Dallas, TX (US); Mark Robert Visokay, Richardson, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 259 days.

This patent is subject to a terminal disclaimer.

(21) Appl. No.: 11/620,447

(22) Filed: Jan. 5, 2007

(65) Prior Publication Data

US 2007/0122962 A1    May 31, 2007

Related U.S. Application Data

(62) Division of application No. 11/118,843, filed on Apr. 29, 2005, now Pat. No. 7,176,076.

(51) Int. Cl.
*H01L 21/8238* (2006.01)
(52) U.S. Cl. .................. 438/199; 438/275; 438/981; 257/E27.064
(58) Field of Classification Search ......... 438/275–279, 438/241, 199–211, 240; 257/E27.064
See application file for complete search history.

(56) References Cited

U.S. PATENT DOCUMENTS

| | | | |
|---|---|---|---|
| 6,528,858 B1 | 3/2003 | Yu et al. | |
| 6,538,278 B1 | 3/2003 | Chau | |
| 6,727,130 B2 | 4/2004 | Kim et al. | |
| 6,979,623 B2 | 12/2005 | Rotondaro et al. | |
| 7,176,076 B2 * | 2/2007 | Chambers et al. | 438/199 |
| 7,226,830 B2 * | 6/2007 | Colombo et al. | 438/216 |
| 7,351,632 B2 * | 4/2008 | Visokay et al. | 438/216 |
| 2006/0246647 A1 | 11/2006 | Visokay et al. | |
| 2006/0246716 A1 | 11/2006 | Colombo et al. | |

* cited by examiner

*Primary Examiner*—H. Jey Tsai
(74) *Attorney, Agent, or Firm*—Warren L. Franz; Wade J. Brady, III; Frederick J. Telecky, Jr.

(57) ABSTRACT

The present invention facilitates semiconductor fabrication by providing methods of fabrication that selectively form high-k dielectric layers within NMOS regions. An I/O dielectric layer is formed in core and I/O regions of a semiconductor device (506). The I/O dielectric layer is removed (508) from the core region of the device. A core dielectric layer is formed in the core region (510). A barrier layer is deposited and patterned to expose the NMOS devices of the core region (512). The core dielectric layer is removed from the core NMOS devices (514). A high-k dielectric layer is formed (514) over the core and I/O regions. Then, the high-k dielectric layer is removed (512) from PMOS regions/devices of the core region and the NMOS and PMOS regions/devices of the I/O region.

17 Claims, 19 Drawing Sheets

SEMICONDUCTOR CMOS DEVICES AND METHODS WITH NMOS HIGH-K DIELECTRIC PRESENT IN CORE REGION THAT MITIGATE DAMAGE TO DIELECTRIC MATERIALS

This application is a divisional of application Ser. No. 11/118,843, filed Apr. 29, 2005.

FIELD OF INVENTION

The present invention relates generally to semiconductor devices and more particularly to CMOS transistor devices and associated methods of manufacture that employ high-k dielectric layers.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

The source and drain are typically formed by adding dopants to targeted regions of a semiconductor body on either side of the channel. A gate electrode structure is formed above the channel, having a gate dielectric formed over the channel and a gate electrode above the gate dielectric. The gate dielectric is an insulator material, which prevents large currents from flowing into the channel when a voltage is applied to the gate electrode, while allowing such an applied gate voltage to set up an electric field in the channel region in a controllable manner. Conventional MOS transistors typically include a gate dielectric formed by depositing or growing silicon dioxide ($SiO_2$) or silicon oxynitride (SiON) over a silicon wafer surface, with doped polysilicon formed over the $SiO_2$ to act as the gate electrode.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, very thin $SiO_2$ gate dielectrics are prone to gate tunneling leakage currents resulting from direct tunneling through the thin gate dielectric. In addition, there are conventional limitations on the ability to form such thin dielectric films with uniform thickness. Furthermore, thin $SiO_2$ gate dielectric layers provide a poor diffusion barrier to dopants, for example, and may allow high boron dopant penetration from the underlying channel region of the silicon during fabrication of the source/drain regions.

Recent MOS and CMOS transistor scaling efforts have accordingly focused on high-k dielectric materials having dielectric constants greater than that of $SiO_2$ (e.g., greater than about 3.9), which can be formed in a thicker layer than scaled $SiO_2$, and yet which produce equivalent field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

The performance of the resulting MOS transistors is dependent upon the high-k gate dielectric material, including the bulk high-k material and on a thickness or equivalent oxide thickness of deposited material. Unlike $SiO_2$, which may be formed by thermal oxidation (growth process), high-k dielectrics are typically deposited over the semiconductor substrate, using chemical vapor deposition (CVD), physical vapor deposition (PVD), atomic layer deposition (ALD), molecular beam epitaxy (MBE), or other deposition processes. While the macroscopic composition (e.g., stoichiometry) of these materials may be controlled to a certain extent during such deposition processes, stoichiometric composition variations within the film may degrade device performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by employing high-k dielectric layers in NMOS devices within a core region and optionally employing barrier layers to protect the high-k dielectric layers and/or other dielectric layers during fabrication of the devices. NMOS and PMOS devices within an input/output (I/O) region having higher operation voltage requirements and, therefore, employ silicon dioxide or silicon oxynitride having a selected equivalent oxide thickness relatively thicker according to the higher voltage requirements. NMOS and PMOS devices within the core region operate with lower operation voltage requirements and, as a result, employ dielectric layers with a relatively thinner equivalent oxide thickness. The NMOS devices within the core region employ high-k dielectric layers whereas the PMOS devices within the core region employ silicon dioxide or silicon oxynitride.

The barrier layers are employed to protect already formed dielectric layers during later dielectric formation processes. The barrier layers provide functions including, but not limited to, mitigating contamination of the underlying dielectric layers, facilitating patterning of dielectric layers, stabilizing composition, mitigating undesired oxidation of the underlying silicon substrate, and the like.

In accordance with an aspect of the invention, an I/O $SiO_2$ or SiON layer is formed in core and I/O regions of a semiconductor device. The I/O $SiO_2$ or SiON layer is removed from the core region of the device. A core $SiO_2$ or SiON layer is formed in the core region. A barrier layer is deposited and patterned to expose the NMOS devices of the core region. The core $SiO_2$ or SiON layer is removed from the core NMOS devices. A high-k dielectric layer is formed over the core and I/O regions. Then, the high-k dielectric layer is removed from PMOS regions/devices of the core region and the NMOS and PMOS regions/devices of the I/O region. The barrier layer is then stripped and a nitridation process is performed that nitrides the I/O $SiO_2$ or SiON layer, the core $SiO_2$ or SiON layer, and the high-k dielectric layer. Subsequently, gate structures and source/drain regions are formed.

In accordance with another aspect of the invention, an I/O oxide layer is formed in core and I/O regions of a semiconductor device. The oxide layer is removed from the core region of the device. A core oxide layer is formed in the core region. The core oxide layer is removed from the core NMOS devices. A high-k dielectric layer is formed over the core and I/O regions. Then, the high-k dielectric layer is removed from PMOS regions/devices of the core region, the PMOS regions/devices of the I/O region and optionally the NMOS regions/devices of the I/O region. A nitridation process is performed that nitrides the I/O oxide layer, the core oxide layer, and the high-k dielectric layer. Subsequently, gate structures and source/drain regions are formed.

In accordance with yet another aspect of the invention, a high-k dielectric layer is first formed in core and I/O regions that comprise NMOS and PMOS regions. The high-k dielectric layer is patterned to remove the layer form the core PMOS region and the I/O region. An I/O $SiO_2$ or SiON layer is formed in the core PMOS region and the I/O region. Subsequently, the I/O $SiO_2$ or SiON layer is removed from the core PMOS region, wherein a core $SiO_2$ or SiON layer is formed. A nitridation process is performed and gate structures and source/drain regions are subsequently formed.

In accordance with yet another aspect of the invention, a high-k dielectric layer is first formed in core and I/O regions of a device that each comprise both NMOS and PMOS regions. Prior to patterning the high-k layer, a barrier layer is formed and patterned to expose the core PMOS region and the I/O region. Subsequently, the high-k layer is removed from the core PMOS region and the I/O region using the barrier layer as a mask to prevent removal from the core NMOS region. Then, an I/O $SiO_2$ or SiON layer is formed in the I/O region and a core $SiO_2$ or SiON layer is formed in the core PMOS region.

BRIEF DESCRIPTION OF THE DRAWINGS

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
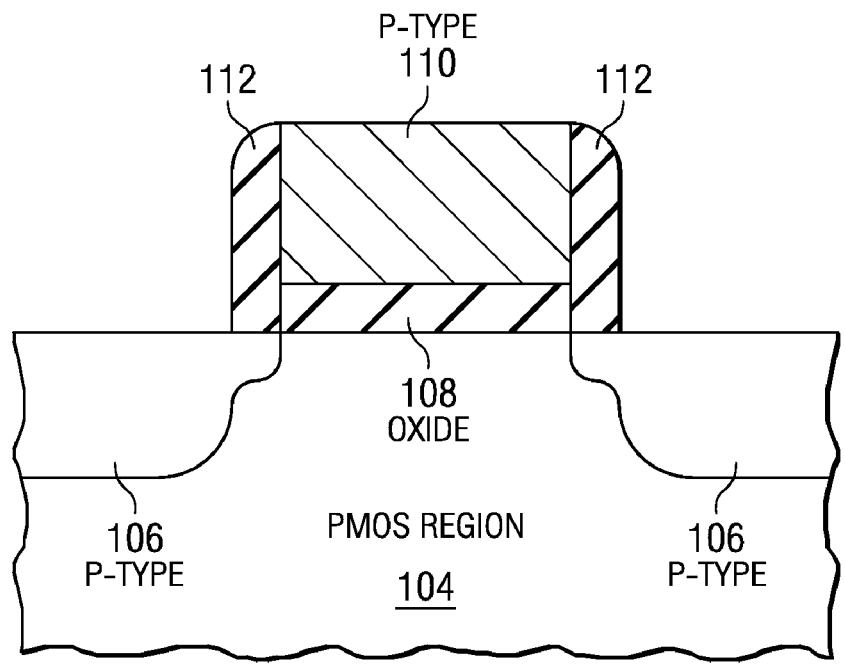
FIG. 1 is a cross sectional view of a conventional PMOS transistor device formed with a dielectric layer and a p-type doped polysilicon gate.

One or more implementations of the present invention will now be described with reference to the attached drawings, wherein like reference numerals are used to refer to like elements throughout, and wherein the illustrated structures are not necessarily drawn to scale.

It is appreciated that semiconductor devices can include transistor devices that operate at varied voltages in different regions of the semiconductor device. As a result, these different devices require varied dielectric thicknesses. One conventional mechanism to account for the different types of devices is to form the transistor devices with the same dielectric thickness required for the higher voltage operation. As a result, transistor devices operating at a relatively low operating voltage were fabricated with a thicker gate dielectric than necessary. This extra thickness can slow operation or speed of such devices. Accordingly, performance of the semiconductor device, particularly transistor devices within the semiconductor device that operate at a relatively lower operating voltage, can be improved. Other conventional mechanisms include using level shifters to change voltage/power levels and the like.

It is also appreciated that semiconductor devices, including those with transistor devices operating at different voltages, can employ high-k dielectric materials in order to obtain an equivalent oxide thickness, but with a thicker dielectric layer. The high-k dielectric material can overcome problems associated with employing $SiO_2$ or SiON as a dielectric layer, which are discussed in further detail below. However, high-k dielectric materials can introduce problems of their own and can degrade performance of PMOS transistor devices, as discussed below.

Some high-k dielectric materials, such as hafnium silicate (HfSiO), can be susceptible to crystallization and/or other damage due to fabrication processes including growth and deposition processes. For example, growing thermal silicon dioxide (e.g., at 1000 degrees Celsius) can cause crystallization of already formed high-k dielectric layers. Crystallization of high-k dielectric materials can create defective grain boundaries, leakage pathways, high dopant diffusivity, and the like. The present invention mitigates this undesired crystallization by employing lower temperatures and/or optimized high-k dielectric film composition including atomic % silicon and atomic % nitrogen.

FIG. 1 is a cross sectional view of a conventional PMOS transistor device 100 formed with silicon dioxide (SiO$_2$) as a dielectric layer and a p-type doped polysilicon gate. This device 100 described is exemplary in nature and is provided to facilitate understanding of the present invention.

The device 100 comprises an n-type well region 104 formed within a p-type semiconductor substrate or body. Implanting an n-type dopant, such as phosphorous, into the semiconductor body with a relatively low dose and high energy, forms the well region 104. P-type source/drain regions 106 are formed within the well region 104. Implanting a p-type dopant, such as boron, into the well region 104 with a relatively high dose and lower energy forms the source/drain regions 106. The p-type source/drain regions can also have an extension portion or lightly doped region (LDD) between the source/drain regions and the channel.

A gate structure or stack overlies the channel and includes a silicon dioxide (SiO$_2$) 108 and a p-type polysilicon layer 110 formed on the SiO$_2$ layer 108. The SiO$_2$ layer 108 (not drawn to scale) operates as a dielectric layer for the gate structure and is typically formed by a thermal growth process. The polysilicon layer 110 is formed on the SiO$_2$ layer 108, after which a patterning operation is performed to form the gate structure. The polysilicon layer 110 is doped with a p-type dopant, such as boron, typically during formation of the source/drain regions 106. Sidewalls 112 are formed on lateral edges of the gate structure in order to protect the gate structure and facilitate formation of the source/drain regions 106. The sidewalls 112 can be formed by depositing an insulative material, such as silicon nitride, silicon dioxide, or both, over the device conformally and then anisotropically etching the layer.

The device 100 operates when a sufficient voltage, referred to as a threshold voltage or greater, is applied to the polysilicon layer 110 of the gate structure. The threshold voltage generates a sufficient electric field across a channel region below the gate structure. When this happens, a conductive path is formed below the gate structure between the source/drain regions 106 allowing current to flow there between. Parameters that determine the threshold voltage are the work function of the polysilicon layer 110 and the doping level in the channel region. Generally, the closer the work function is to the conduction band of the silicon substrate, the lower the magnitude of the threshold voltage for NMOS devices and the closer the work function is to the valence band of the silicon substrate, the lower the magnitude of the threshold voltage for PMOS devices.

The thickness of the SiO$_2$ layer 108 also affects operation of the device 100. Generally, the speed, drive current, capacitance, and other functional characteristics are determined by the thickness of the SiO$_2$ layer 108. Generally, the thinner the SiO$_2$ layer 108, the faster the device 100 can operate and the lower the magnitude of threshold voltage that can be established/tolerated. However, there are electrical and physical limitations on the extent to which thicknesses of the SiO$_2$ layer 108 can be reduced. For example, very thin dielectrics are prone to gate tunneling leakage currents resulting from direct tunneling through the thin gate dielectric. In addition, there are conventional limitations on the ability to form such thin dielectric films with uniform thickness. Furthermore, thin dielectric layers provide a poor diffusion barrier to dopants.

Figure 2:
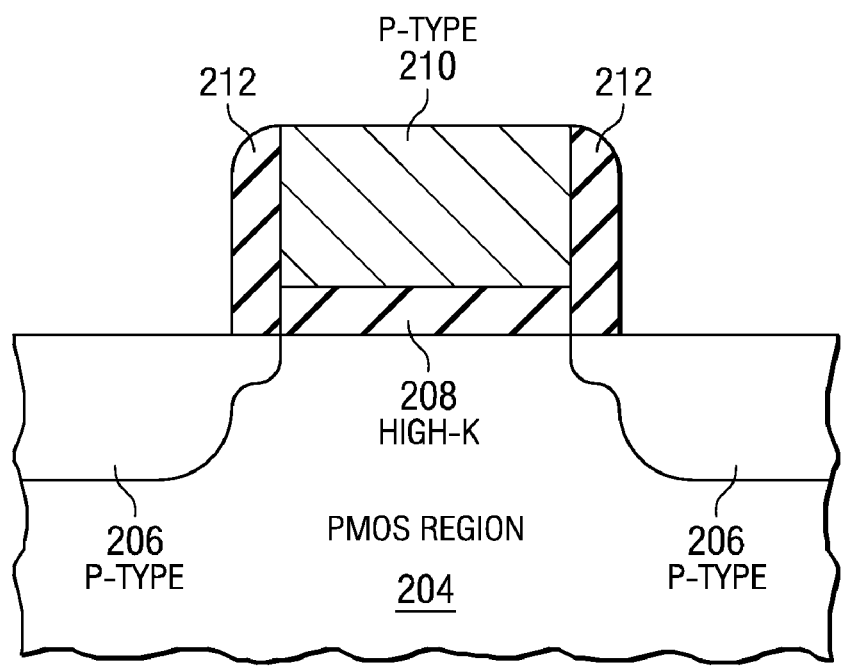
FIG. 2 is a cross sectional view of another conventional PMOS transistor device formed with a high-k dielectric layer and a p-type doped polysilicon gate.

FIG. 2 is a cross sectional view of another conventional PMOS transistor device 200 formed with a high-k dielectric layer and a p-type doped polysilicon gate. The high-k dielectric layer permits a thicker dielectric layer to be employed with the device and yet have similar electrical properties to a thinner SiO$_2$ or SiON layer, such as shown in the prior art FIG. 1. The high-k dielectric layer mitigates some of the problems associated with employing SiO$_2$ or SiON layers, such as, gate tunneling, leakage currents, and the like. However, employing the high-k dielectric layer with the PMOS transistor device 200 presents other problems, which are discussed below. The device 200 described below is exemplary in nature and is provided to facilitate understanding of the present invention.

The device 200 comprises an n-type well region 204 formed within a semiconductor substrate or body. Implanting an n-type dopant, such as phosphorous, into the semiconductor body with a relatively low dose and high energy, forms the well region 204. P-type source/drain regions 206 are formed within the well region 204. Implanting a p-type dopant, such as boron, into the well region 204 with a relatively high dose and lower energy forms the source/drain regions 206. The p-type source/drain regions can also have an extension portion or lightly doped region (LDD).

A gate structure or stack comprises a high-k dielectric layer 208 and a p-type polysilicon layer 210 formed on the high-k dielectric layer 208. The high-k dielectric layer 208 is formed over the device using a deposition process, such as a chemical vapor deposition process (CVD) and operates as a dielectric layer for the gate structure. The layer 208 is comprised of high-k dielectric materials that have dielectric constants greater than that of SiO$_2$ (e.g., substantially greater than about 3.9), which can be formed in a thicker layer than scaled SiO$_2$, and yet which produce equivalent field effect performance. The polysilicon layer 210 is formed on the high-k dielectric layer 208, after which a patterning operation is performed to form the gate structure. The polysilicon layer 210 is doped with a p-type dopant, such as boron, typically during formation of the source/drain regions 206. Sidewalls 212 are formed on lateral edges of the gate structure in order to protect the gate structure and facilitate formation of the source/drain regions 206. The sidewalls 212 can be formed by depositing an insulative material, such as silicon dioxide, over the device conformally and then anisotropically etching the device.

The device 200, again, operates when a sufficient voltage, referred to as the threshold voltage, is applied to the polysilicon layer 210 of the gate structure. The threshold voltage generates a sufficient electric field across a channel region below the gate structure. When this happens, a conductive path is formed below the gate structure between the source/drain regions 206 allowing current to flow there between. Parameters that determine the threshold voltage are the work function the polysilicon layer 210, which has a concentration of p-type dopants, and the doping level in the channel region, which has a concentration of n-type dopants. Generally, the closer the work function is to the conduction band of the silicon substrate, the lower the magnitude of the threshold voltage for NMOS devices and the closer the work function is to the valence band of the silicon substrate, the lower the magnitude of the threshold voltage for PMOS devices.

The thickness or equivalent oxide thickness of the high-k dielectric layer 208 also affects operation of the device 200. As stated above, the speed, drive current, capacitance and other functional characteristics are a function of the thickness or equivalent oxide thickness of the high-k dielectric layer 208. Generally, the thinner the high-k dielectric layer 208, the faster the device 200 can operate and the lower the magnitude of threshold voltage that can be established.

The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Use of high-k dielectric materials can have adverse effects on PMOS devices employed therein. As a result, device performance can be degraded. Generally, the use of high-k dielectric materials or layers for conventional PMOS devices results in variable, non-predictable offsets in the threshold voltage and degraded inversion capacitance.

The threshold voltages are offset in PMOS devices employing high-k gate dielectrics. One cause of this shift may be due to dopants present in high-k dielectric layers that result in high fixed charge density. This leads offsets in threshold voltages that can be difficult to account for by counter doping the channel region, typically performed prior to gate formation in MOS devices.

Inversion capacitance degradation also occurs as a result of poly depletion by the high-k layer. A p-doped polysilicon gate electrode layer experiences a depletion of positive charges near an interface with the high-k dielectric layer. As a result, the electric field present in the channel region is reduced. The poly depletion effect causes the high-k dielectric layer to electrically function as if it were thicker than its true thickness. A contributing factor to the poly depletion is that dopant concentration for p-type polysilicon gate electrode layers is limited because p-type dopants, such as boron, tend to diffuse out of the p-type doped gate structures and thus resist higher dopant levels.

Figure 3:
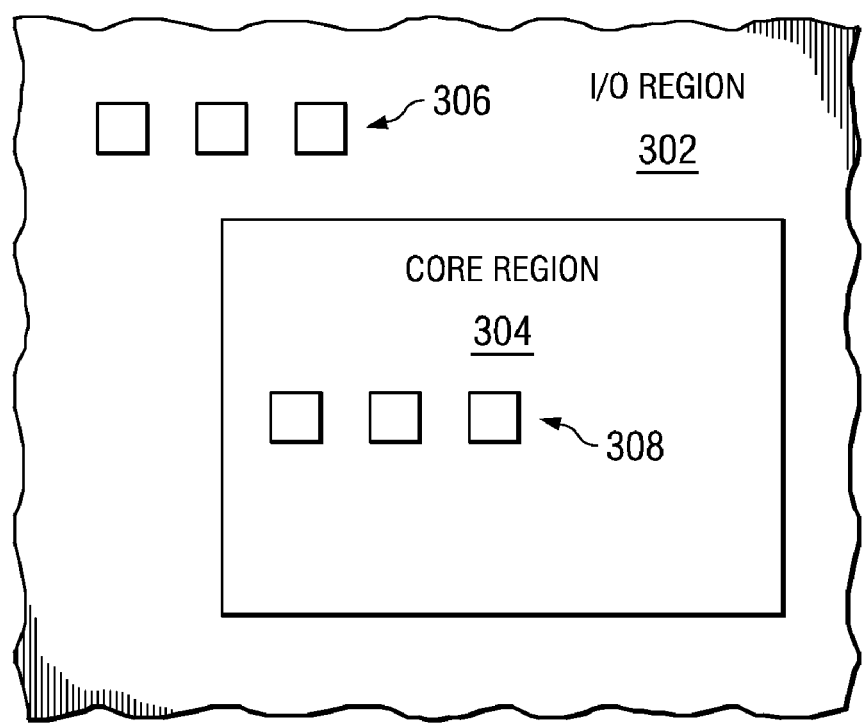
FIG. 3 is a block diagram illustrating an exemplary I/O region and an exemplary core region within a semiconductor device in accordance with an aspect of the present invention.

FIG. 3 is a block diagram illustrating an exemplary I/O region 302 and an exemplary core region 304 within a semiconductor device 300 in accordance with an aspect of the present invention. The provided diagram is exemplary in nature and is provided to facilitate understanding of the present invention.

The I/O region 302 comprises CMOS transistor devices 306, including NMOS and PMOS I/O transistor devices, which generally operate at relatively higher power (e.g., 1.5, 2.5, 3.3 volts) and lower speeds. The core region 304 comprises CMOS transistor devices 308, including NMOS and PMOS core transistor devices, which operate at relatively lower power (e.g., 1 volt) and higher speeds than the CMOS transistor devices 306 of the I/O region 302.

The I/O region 302 is generally the higher-voltage logic portion of the device 300. The I/O region 302 typically handles interfacing with external devices (data in and out of the chip), power management, voltage regulation, and the like. The transistors 306 typically, but not necessarily, operate at higher voltage than the core transistors 308 and have lower performance requirements, but are important to the overall device 300 operation.

Generally, the core region 304 can encompass low-voltage logic as well as memory functions (e.g., SRAM), including the memory array and periphery of the memory. Typically, the transistors 308 within the core region are high-performance transistors that do the bulk of the work by the device 300 and handle operations such as, calculations and the like. It is noted that memory portions of the device 300 (e.g., SRAM) can comprise both core and periphery regions.

Generally, in transistor devices, a source and drain are typically formed by adding dopants to targeted regions of a semiconductor substrate or body on either side of a channel. A gate structure is formed above the channel, having a gate dielectric or dielectric layer formed over the channel and a gate electrode above the gate dielectric. The gate dielectric is an insulator material, which prevents large currents from flowing into the channel when a voltage is applied to the gate electrode, while allowing such an applied gate voltage, also referred to as an operating voltage, to set up an electric field in the channel region in a controllable manner.

A thickness of the dielectric layer is determined by, among other things, the operating voltage and a desired speed of operation. Generally, a higher operating voltage/power requires a thicker dielectric layer. However, faster speed of operation requires a thinner dielectric layer. Accordingly, both factors can be at odds with each other.

As stated above, common dielectric materials that are employed in transistor devices are silicon dioxide ($SiO_2$) and silicon oxynitride (SiON), which are typically formed over a silicon wafer surface. However, other dielectric materials, referred to as high-k dielectric materials can be employed to attain an equivalent oxide thickness that is smaller than its actual thickness. This is due to the dielectric constant for high-k dielectric materials being substantially larger than the dielectric constant of silicon dioxide, which is about 3.9. The dielectric constant of high-k materials is a function of the composition and amount of crystallization.

Because of the higher voltage and lower operational speeds, the I/O CMOS transistor devices 306 can have a thicker dielectric layer, expressed in terms of equivalent oxide thickness. As a result, the thicker dielectric layer can mitigate some of the problems, such as tunneling, associated with thinner dielectric layers. In contrast, the core devices 308 require relatively thin dielectric layers to permit faster operation. NMOS and PMOS devices of the I/O CMOS transistor devices 306 employ silicon dioxide or silicon oxynitride as dielectric layers. NMOS devices of the core transistor device 308 employ a high-k dielectric layer, such as hafnium silicon oxynitride, and the PMOS devices of the core transistor devices employ a silicon dioxide or silicon oxynitride layer. As a result, the NMOS devices within the core benefit from employing high-k dielectric material without the PMOS devices being substantially negatively impacted.

Figure 4:
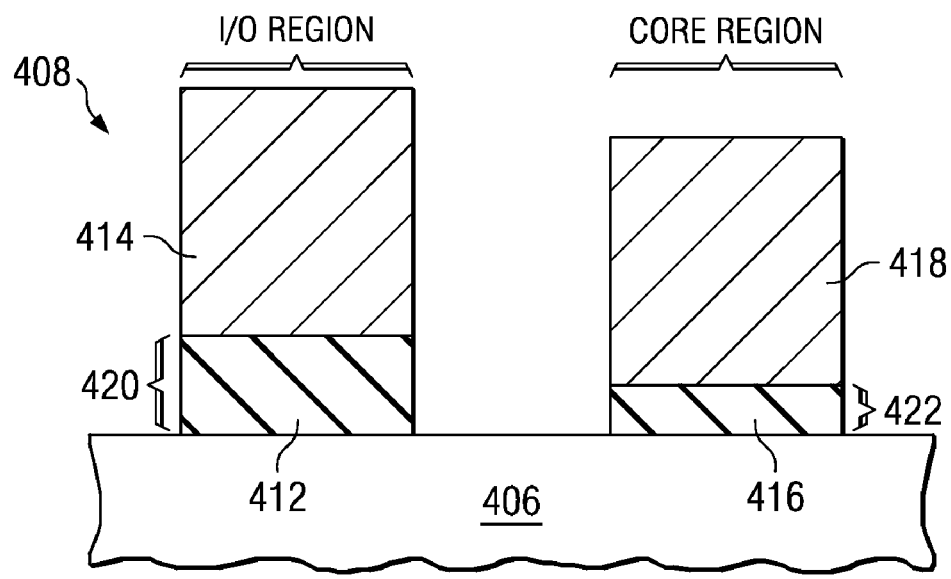
FIG. 4, a cross sectional view illustrating high and low operating voltage transistor devices in accordance with an aspect of the present invention is presented.

Turning now to FIG. 4, a cross sectional view illustrating high and low operating voltage transistor devices in accordance with an aspect of the present invention is presented. The view provided is somewhat simplified to further illustrate and compare thicknesses of dielectric layers in core and I/O regions.

A high voltage transistor device 408 is located within an I/O region and a low voltage transistor device 410 is located within a core region. The high voltage transistor device 408 has a relatively high operational voltage or applied voltage (e.g., 1.5 volts or more) whereas the low voltage transistor device 410 has a relatively low operational voltage or applied voltage (e.g., 1.0 volts).

The high voltage transistor device 408 includes a dielectric layer 412 and a gate 414. The dielectric layer 412 is comprised of a dielectric material, such as silicon dioxide or silicon oxynitride and has a first thickness 420, which is related to the device's operating voltage. The gate 414 is comprised of an electrode material such as polysilicon, metal or metal compound and is formed on the dielectric layer 412.

The low voltage transistor device 410 also includes a dielectric layer 416 and a gate 418. Again, the dielectric layer 416 is comprised of a dielectric material, such as silicon dioxide, silicon oxynitride, hafnium silicon oxynitride, or another suitable high-k dielectric material, but has a second thickness 422, which is related to the device's operating voltage. The dielectric material varies according to whether the device 410 is a PMOS or NMOS device. Accordingly, for PMOS, the dielectric material is an silicon dioxide or silicon oxynitride and for NMOS, the dielectric material is a high-k dielectric material. The gate 418 is comprised of an electrode material such as polysilicon, metal or metal electrode and is formed on the dielectric layer 416. Such gate is typically, but need not be the same material (and thickness) as the gate 414 for the I/O region device 408.

The high voltage transistor device 408 operates at a higher operating voltage (e.g., the gate voltage) than the low voltage transistor device 410. As a result, the high voltage transistor device 408 requires a thicker dielectric layer. Accordingly, the thickness (EOT) of the dielectric layer 412 for the high voltage transistor device 408, the first thickness 420, is greater than the thickness (EOT) of the dielectric layer 416 for the low voltage transistor device 410, the second thickness 422.

By permitting the dielectric layer 416 of the low voltage transistor 410 to have a relatively small thickness, the low voltage transistor device 410 can operate at higher speeds than conventionally formed devices with thicker dielectric layers.

Figure 5:
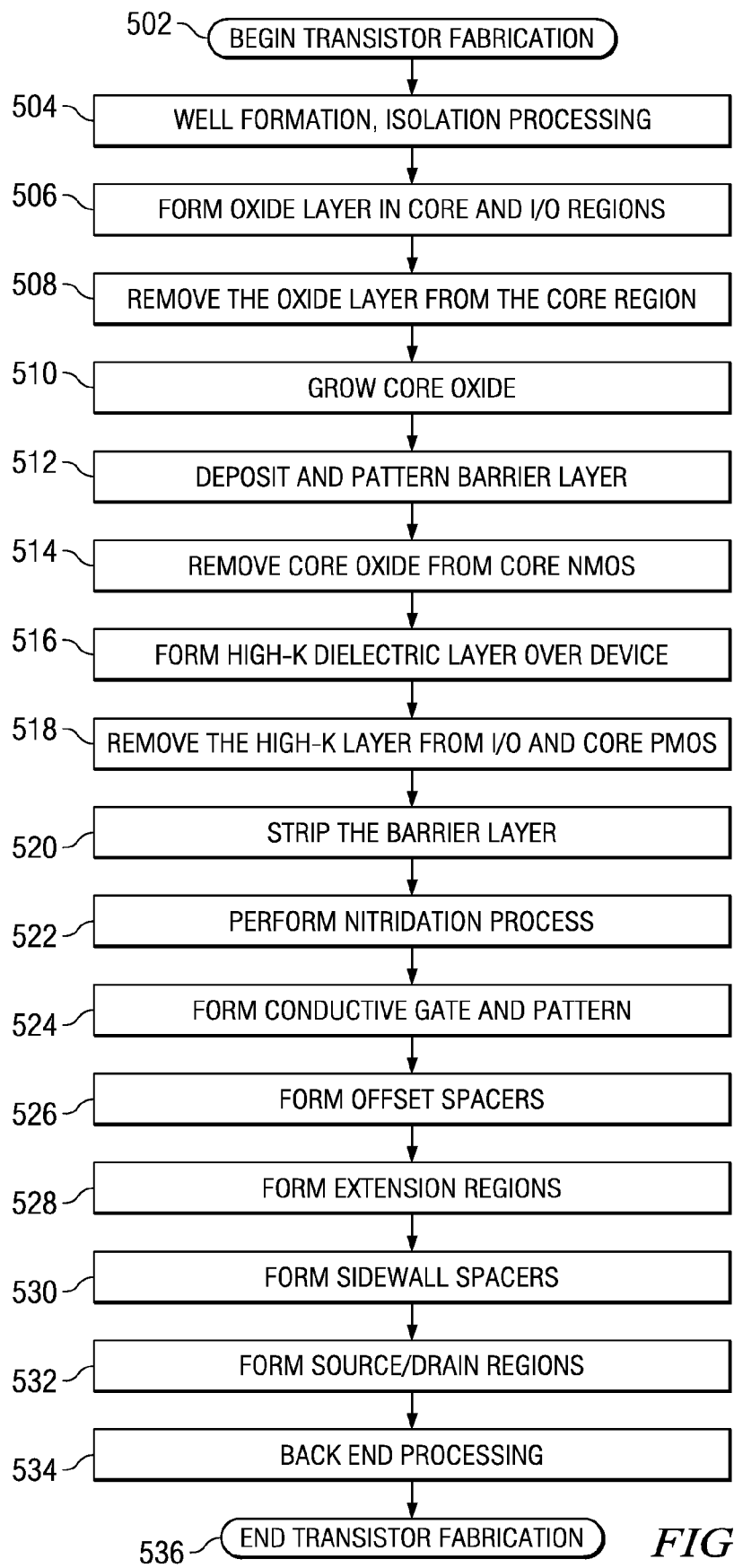
FIG. 5 is a flow diagram illustrating a method of fabricating a CMOS semiconductor device having a core region and an I/O region that mitigates damage to dielectric layers by employing a barrier layer in accordance with an aspect of the present invention.

FIG. 5 is a flow diagram illustrating a method 500 of fabricating a CMOS semiconductor device having a core region and an I/O region in accordance with an aspect of the present invention. The method 500 selectively employs high-k dielectric materials for dielectric layers of NMOS devices within the core region and employs silicon oxynitride for dielectric layers of PMOS devices within the core region and for dielectric layers of NMOS and PMOS devices within the I/O region. The silicon oxynitride dielectric layers are protected during later fabrication processes by employing a barrier layer.

While the exemplary method 500 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 500 begins at block 502, wherein transistor fabrication is initiated, and transistor well formation and isolation processing is performed at block 504 thereby defining NMOS and PMOS regions within core and I/O regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 500 continues at block 506, wherein an I/O dielectric layer is formed over devices within both the core and I/O regions. In one example, the dielectric layer comprises a thin, thermally grown silicon dioxide layer. In another example, the dielectric layer comprises a thin SiON layer. Subsequently, the dielectric layer is patterned at block 508 in order to remove the $SiO_2$ or SiON layer from the core region while retaining the $SiO_2$ or SiON layer in the I/O region.

A core dielectric layer is formed by growing $SiO_2$ or SiON within the core region at block 510. The core dielectric layer is thinner than the I/O dielectric layer to accommodate lower operating voltages and to facilitate faster device operation.

A barrier layer is formed on the core and I/O dielectric layers and patterned to expose the NMOS region of the core region and cover the other regions of the device at block 512. The barrier layer can protect the I/O and core dielectric layers from later fabrication processes and is comprised of a suitable material, such as polysilicon, SiGe, Ge, silicon nitride ($Si_3N_4$), silicon carbide (SiC) or carbon-doped $SiO_2$ (SiOC). A suitable deposition process is used to form the barrier layer with a relatively large selected thickness. Additionally, the barrier layer is also resistant to etching by a later performed high-k dielectric etch/patterning process. The barrier layer thickness is determined by selecting a layer thick enough to prevent oxidation of any underlying layers while still maintaining its etch resistance.

The core dielectric layer is removed from the NMOS region of the core region at block 514 by employing an etch process selective to the barrier layer. The etch process removes the core dielectric layer material form the NMOS region of the core region, but does not remove the core dielectric layer material and/or the I/O dielectric layer material because the barrier layer prevents such etching from occurring.

Continuing, a high-k dielectric layer is formed over the device at block 516 in a blanket operation in both the core and I/O regions. The high-k dielectric layer forms on the semiconductor substrate (well region) within the NMOS region of the core region. In the other regions, the high-k dielectric layer forms on the barrier layer. The high-k dielectric layer is formed by depositing a suitable high-k material, such as hafnium silicate (HfSiO), having a dielectric constant substantially greater than 3.9. Additionally, nitrogen (N) may be introduced during the formation of the high-k dielectric layer or can be added subsequently in a nitridation process. An example of suitable procedures to form the high-k dielectric layer are provided below.

Prior to deposition of the high-k dielectric material, a suitable surface preparation is typically performed. Unlike silicon dioxide ($SiO_2$), which may be formed by thermal oxidation (growth process), the high-k dielectric layer is formed by depositing a high-k dielectric material over the device, using chemical vapor deposition (CVD), physical vapor deposition (PVD), atomic layer deposition (ALD), molecular beam epitaxy (MBE), or other suitable deposition processes. The deposition process is performed so as to result in a thickness that results in a desired or selected equivalent oxide thickness (EOT). As stated above, high-k dielectric materials have dielectric constants that are greater than that of silicon dioxide (e.g., substantially greater than about 3.9). As a result, the high-k dielectric layer can be formed in a thicker layer than scaled silicon dioxide, and yet produce equivalent field effect performance. The relative electrical performance of such high-k dielectric materials is often expressed as EOT, because the high-k material layer may be thicker, while still providing the equivalent electrical effect of a much thinner layer of $SiO_2$ or SiON. Since the dielectric constant "k" is higher than silicon dioxide, a thicker high-k dielectric layer can be employed to mitigate tunneling leakage currents, while still achieving the equivalent electrical performance of a thinner layer of thermally grown silicon dioxide.

Any suitable dielectric may be deposited at block 516 having a dielectric constant higher than that of $SiO_2$, including but not limited to binary metal oxides including aluminum oxide ($Al_2O_3$), zirconium oxide ($ZrO_2$), hafnium oxide (HfO$_2$), lanthanum oxide (La$_2$O$_3$), yttrium oxide (Y$_2$O$_3$), titanium oxide (TiO$_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

The high-k dielectric layer is removed from the PMOS regions of the core region and the entire (PMOS and NMOS regions) I/O region at block 518 by employing an etch process selective to the barrier layer. A photoresist mask that covers the NMOS region of the core region and exposes elsewhere is employed to facilitate the patterning. Subsequently, the barrier layer is removed at block 520 by an etch process selective to SiO$_2$, SiON and the high-k material. For example, a barrier layer comprised of Si$_3$N$_4$ can be stripped using phosphoric acid.

After removal of the barrier layer, a nitridation process is performed at block 522 that adds nitrogen to the high-k dielectric layer, the core dielectric layer, and the I/O dielectric layer. The core dielectric layer becomes nitrided and, if comprised of silicon dioxide, converts from silicon dioxide to silicon oxynitride. Similarly, the I/O dielectric layer becomes nitrided and, if comprised of silicon dioxide, transforms from silicon dioxide to silicon oxynitride as an I/O silicon oxynitride layer.

It is appreciated that variations of the method 500 without employing a barrier layer are contemplated and are in accordance with the present invention. Some of the protective benefits of the barrier layer can be lost in such variations, but less processing steps may be required.

Dielectric characteristics of NMOS devices within the core region are a function of the composition and thickness of the high-k dielectric layer. Dielectric characteristics of PMOS devices within the core region are a function of the thickness of the core dielectric (silicon oxynitride (nitrided)) layer. Dielectric characteristics of NMOS and PMOS devices within the I/O region are a function of the composition and thickness of the I/O dielectric layer.

A conductive gate electrode layer is then deposited over the device at block 524 and patterned to form conductive gate electrodes in PMOS and NMOS regions of the core and I/O regions. As an example, a polysilicon layer may be deposited via chemical vapor deposition (CVD) and patterned via etching to form gate electrodes in both NMOS and PMOS regions, respectively. However, other types of conductive materials, such as metal or metal compound, can also be employed in accordance with the present invention.

An offset spacer is then formed on lateral edges of the conductive gate electrodes at block 526. For example, a thin offset layer (e.g., an silicon dioxide or silicon nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at block 528 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. An n-type dopant (e.g., phosphorous) can be implanted with a low energy into the NMOS region to form NMOS extension regions. Similarly, a p-type dopant (e.g., boron) can be implanted with a low energy into the PMOS region to form PMOS extension regions. A thermal process such as a rapid thermal anneal can then be employed to activate the extension region dopants, which causes the extension regions to diffuse laterally slightly underneath the offset spacer toward the channels.

Still referring to FIG. 5, sidewall spacers are then formed on the gate structures at block 530. The sidewall spacers comprise an insulating material such as a silicon dioxide, a silicon nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS and PMOS regions of the core and I/O regions at block 532. Source/drain regions are formed within the NMOS regions by masking the PMOS regions with a resist mask, exposing the NMOS regions, and implanting n-type dopant(s) (e.g., phosphorous). Similarly, source/drain regions are formed within the PMOS regions by masking the NMOS regions with a resist mask, exposing the PMOS regions, and implanting p-type dopant(s) (e.g., boron). The source/drain dopant is introduced into the exposed areas (top of gate electrode and active areas not covered by the sidewall spacers).

Subsequently, other features and/or components of the device can be formed at block 534 ending fabrication at block 536. Conductive contacts can be formed through a PMD layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material.

It is noted that the method 500 is discussed in terms of core and I/O regions in order to facilitate a better understanding of the present invention. However, the present invention is applicable to two or more regions that have varying requirements for dielectric thickness due to operational requirements including speed and/or voltage levels. Also, the regions can individually comprise memory, logic, or combinations thereof.

Figure 6A:
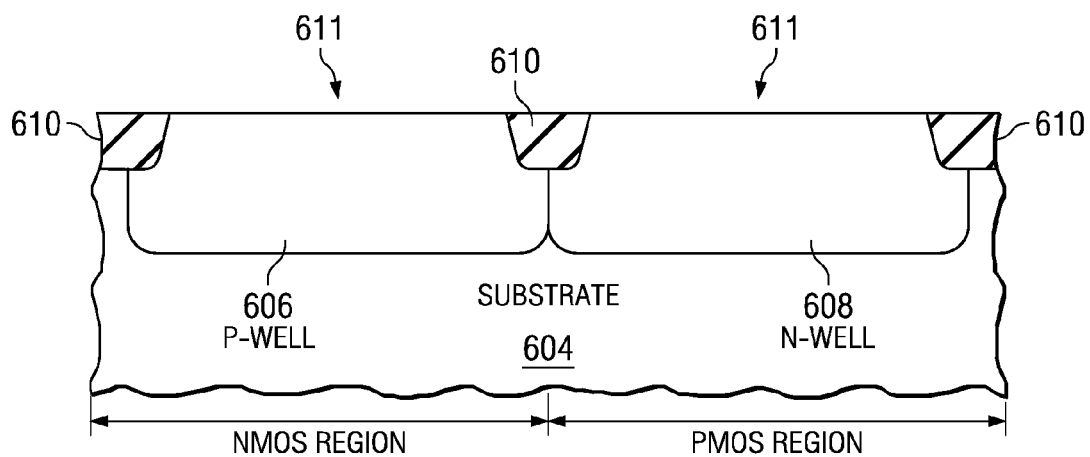
FIGS. 6A to 6V are a plurality of fragmentary cross section diagrams illustrating a transistor device having core and I/O regions and being formed in accordance with the present invention by the method of FIG. 5.
Figure 6B:
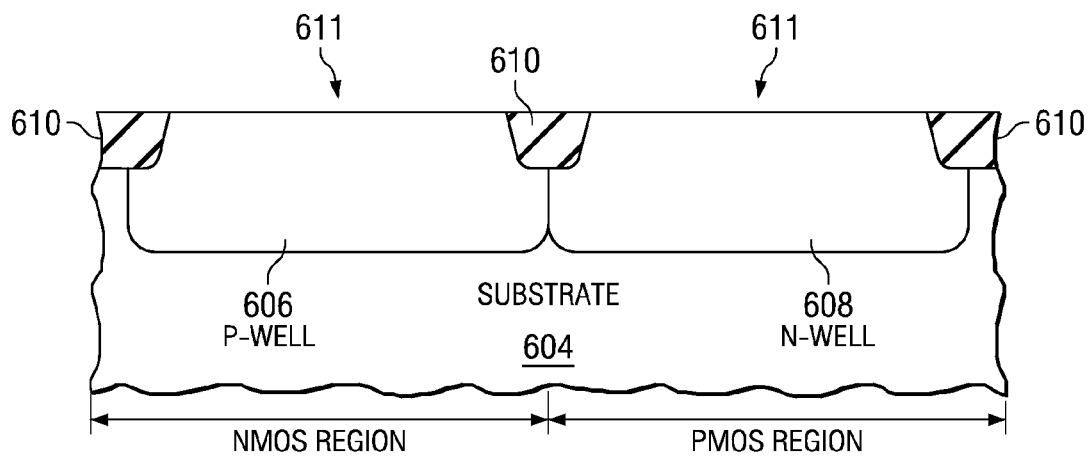
Figure 6C:
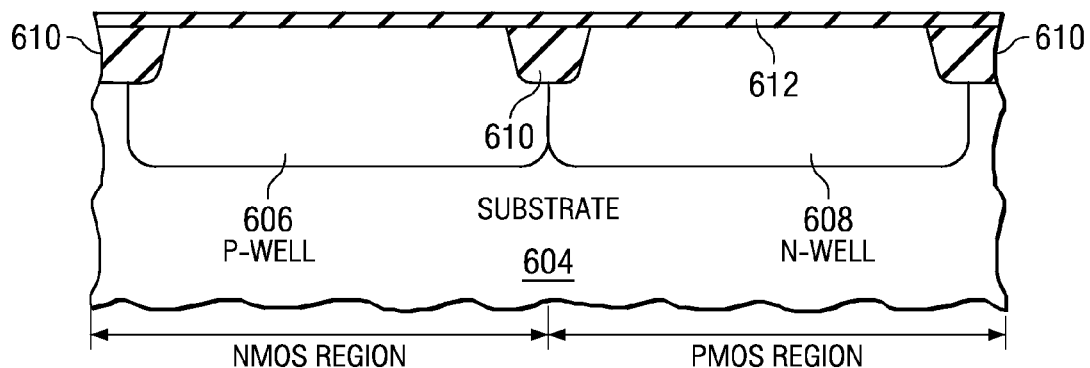
Figure 6D:
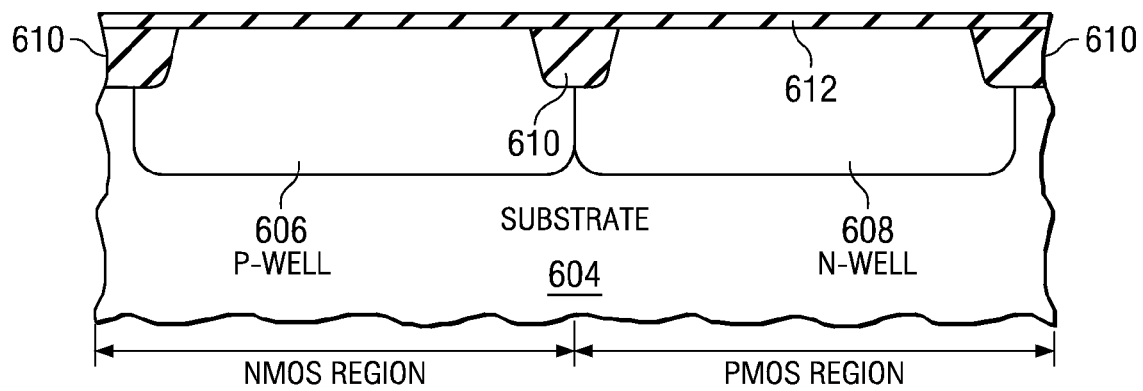
Figure 6E:
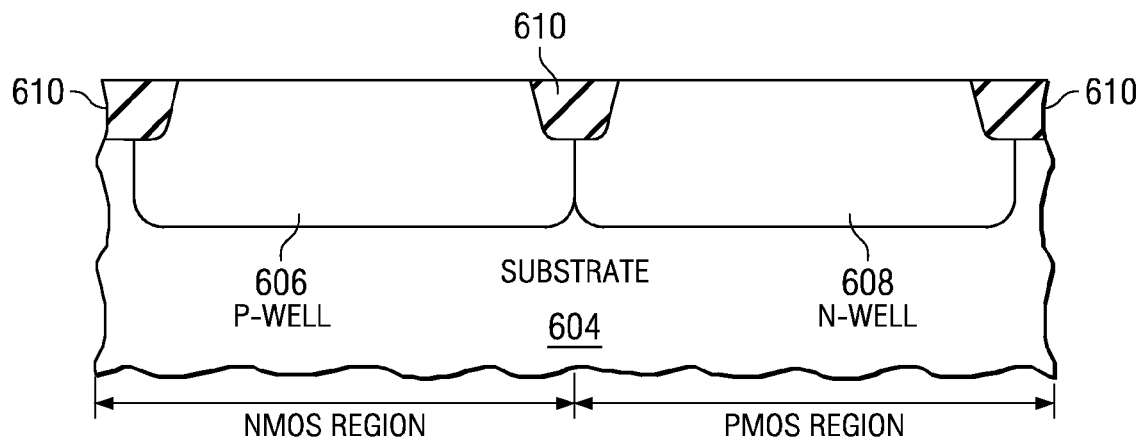
Figure 6F:
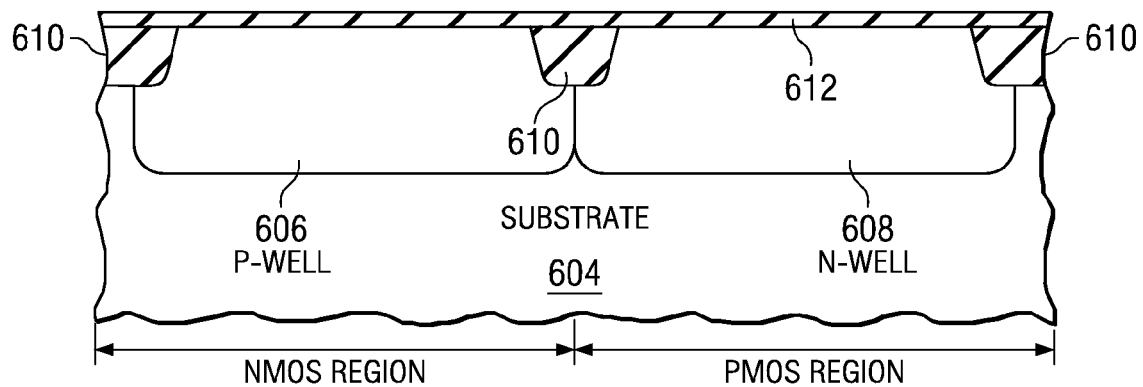
Figure 6G:
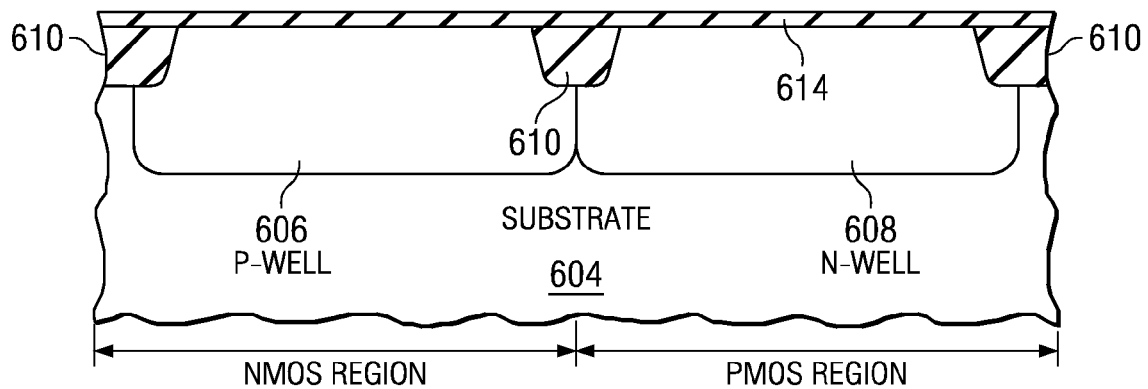
Figure 6H:
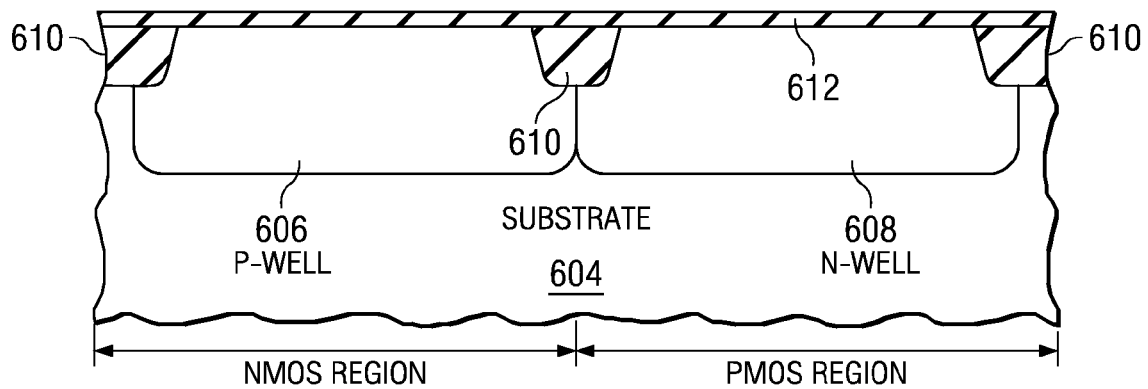
Figure 6I:
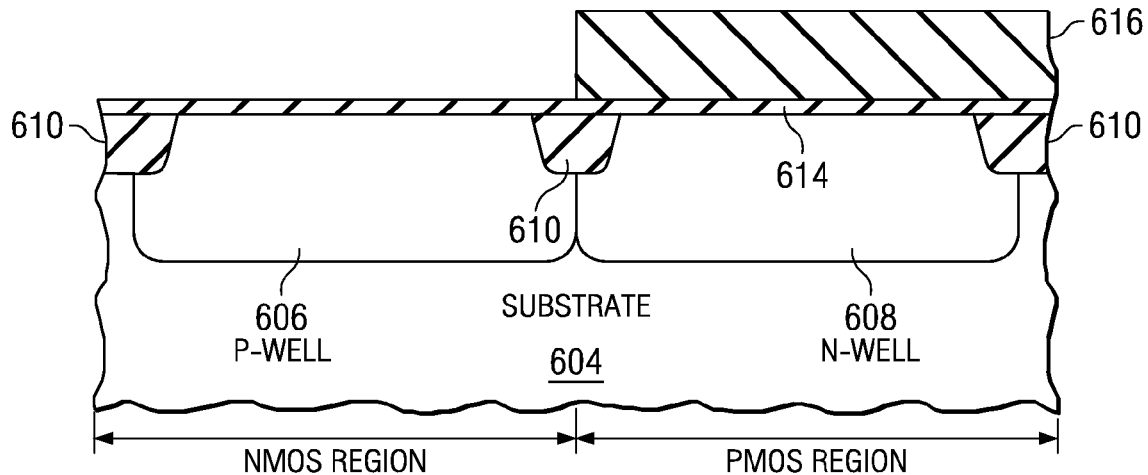
Figure 6J:
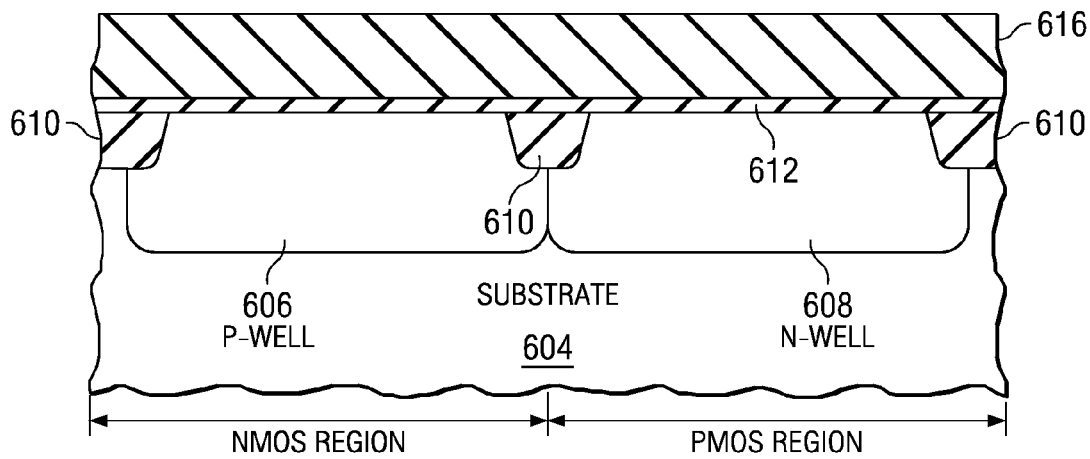
Figure 6K:
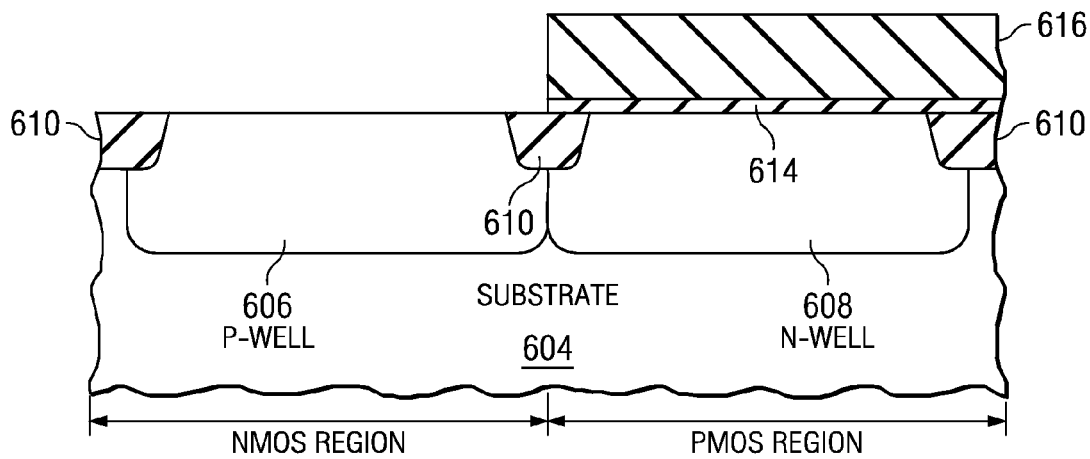
Figure 6L:
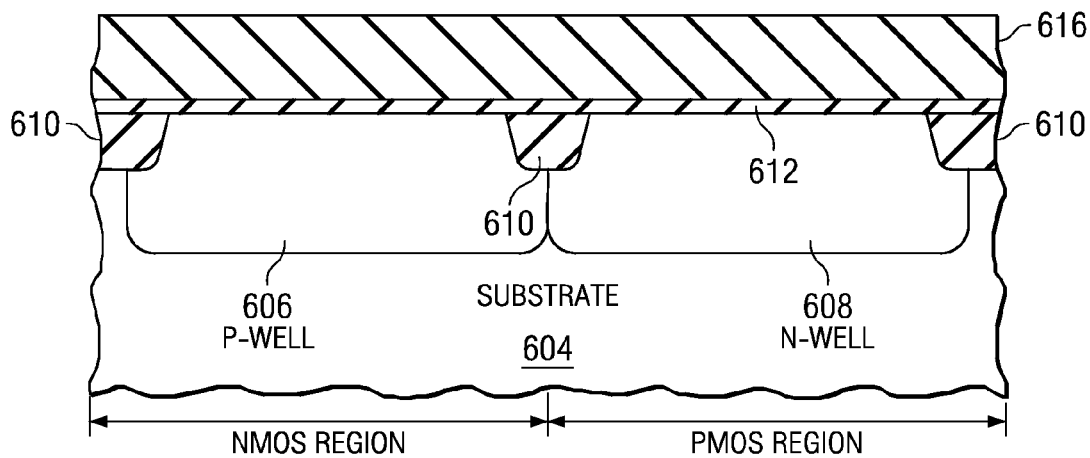
Figure 6M:
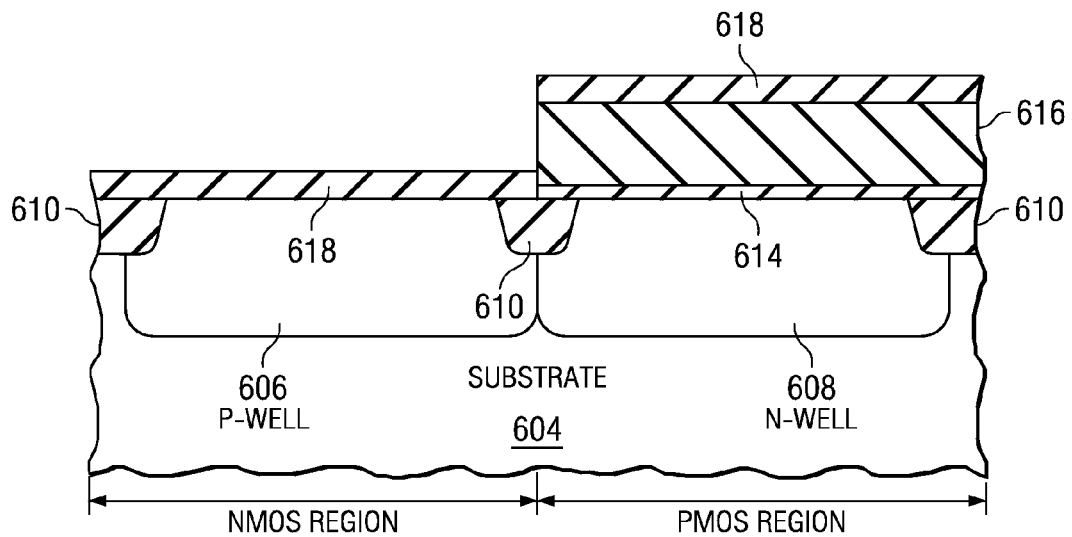
Figure 6N:
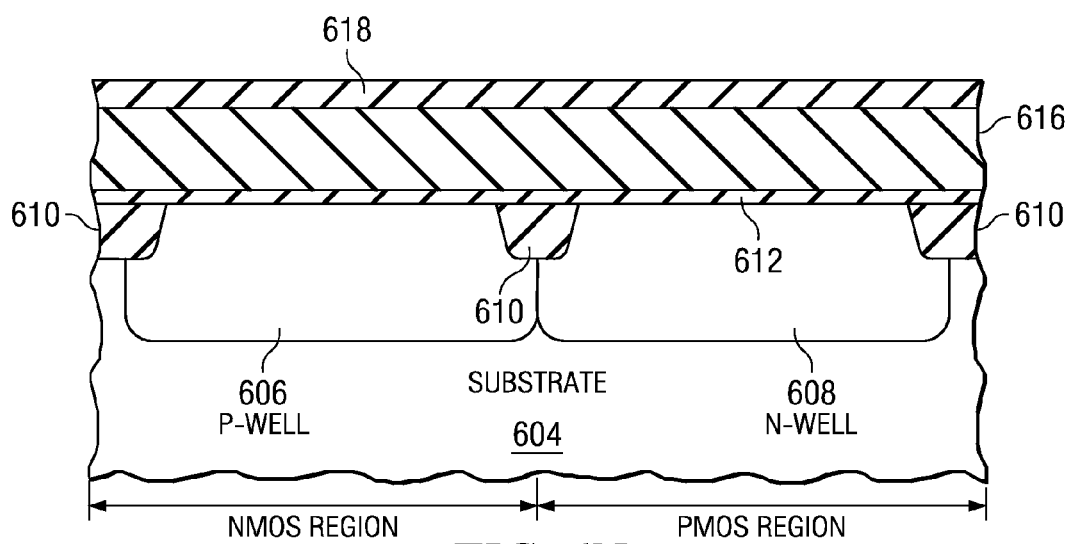
Figure 6O:
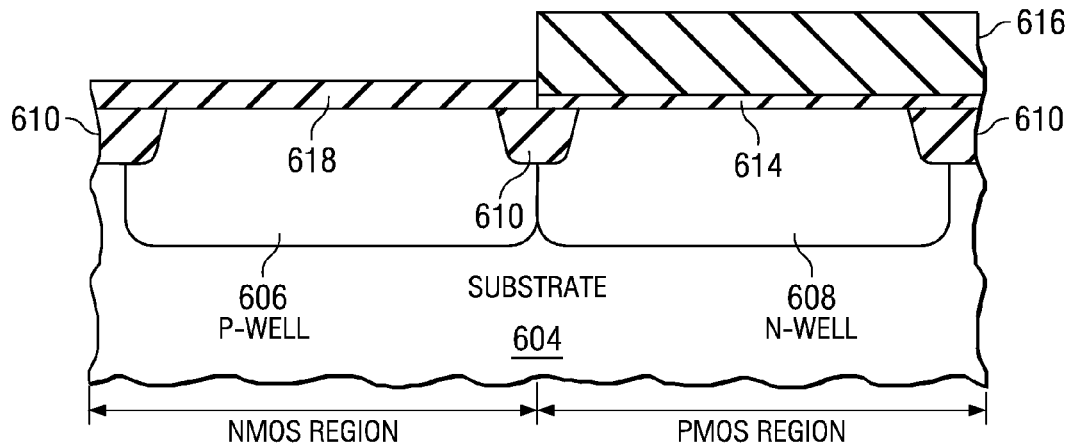
Figure 6P:
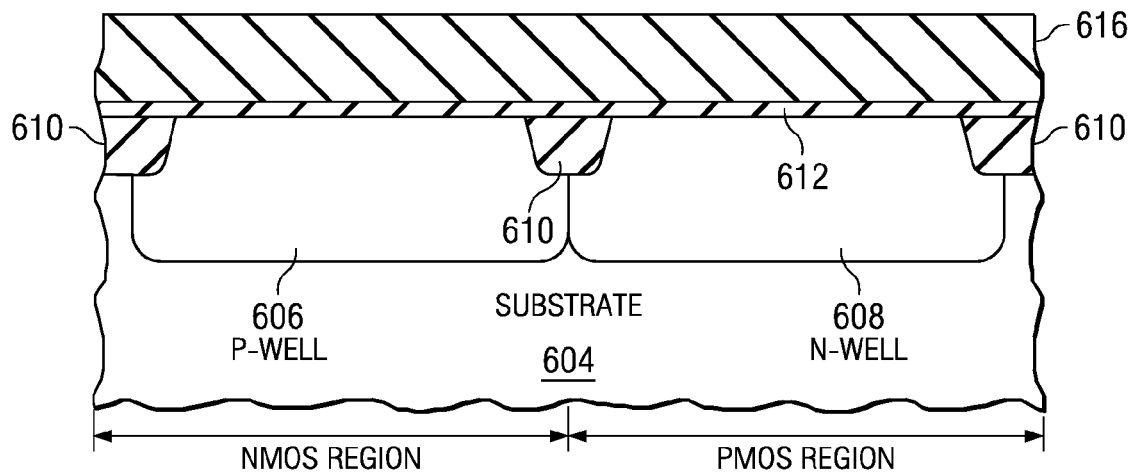
Figure 6Q:
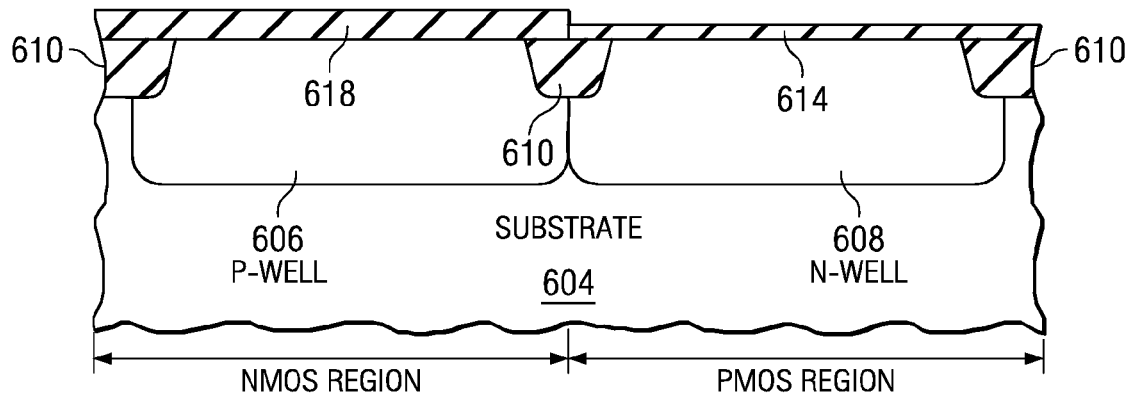
Figure 6R:
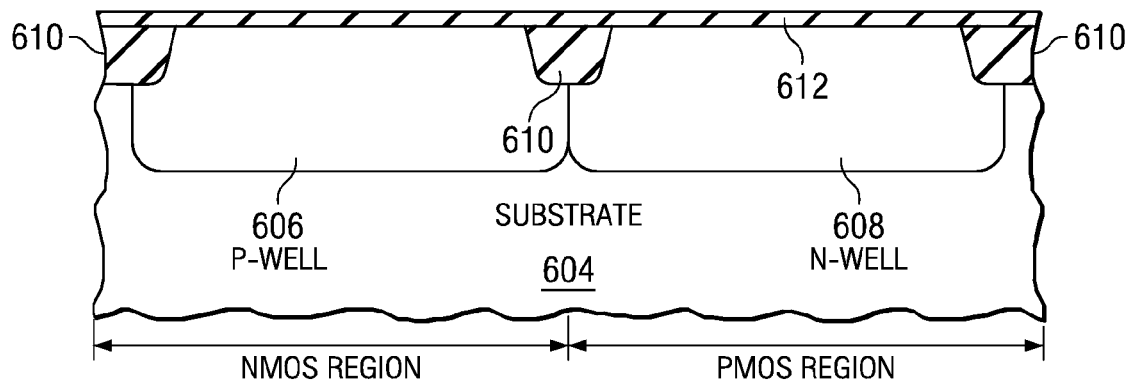
Figure 6S:
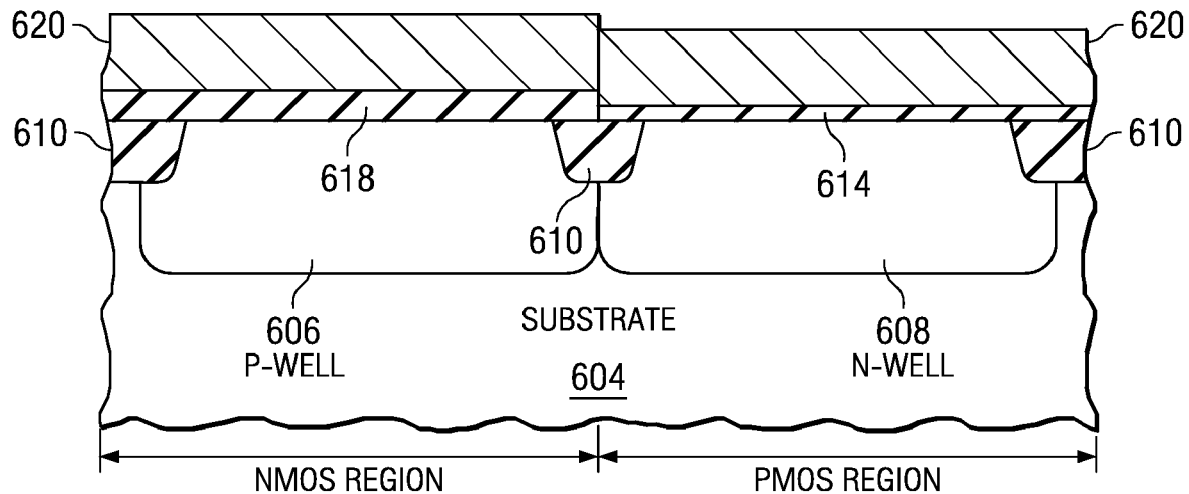
Figure 6T:
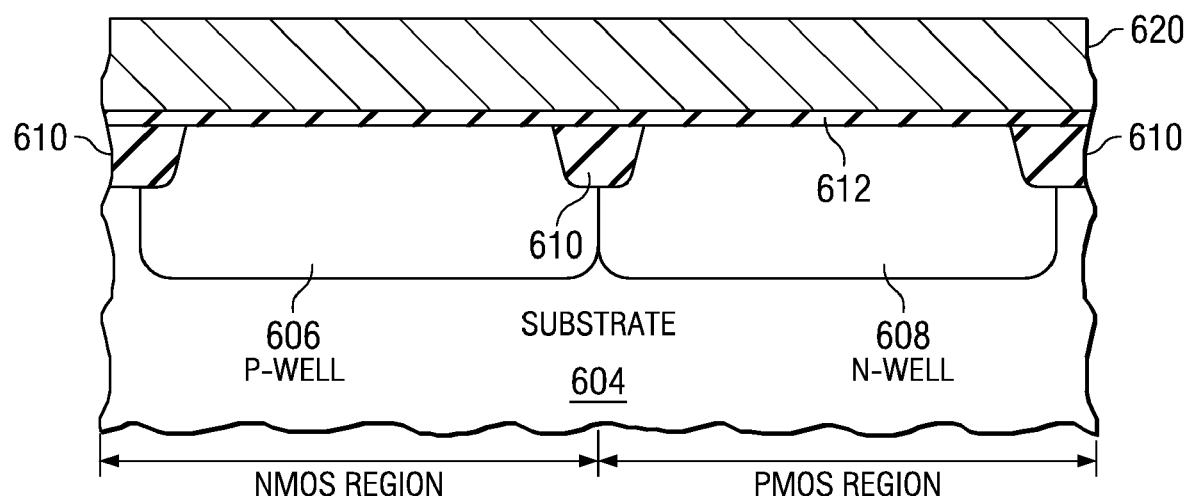
Figure 6U:
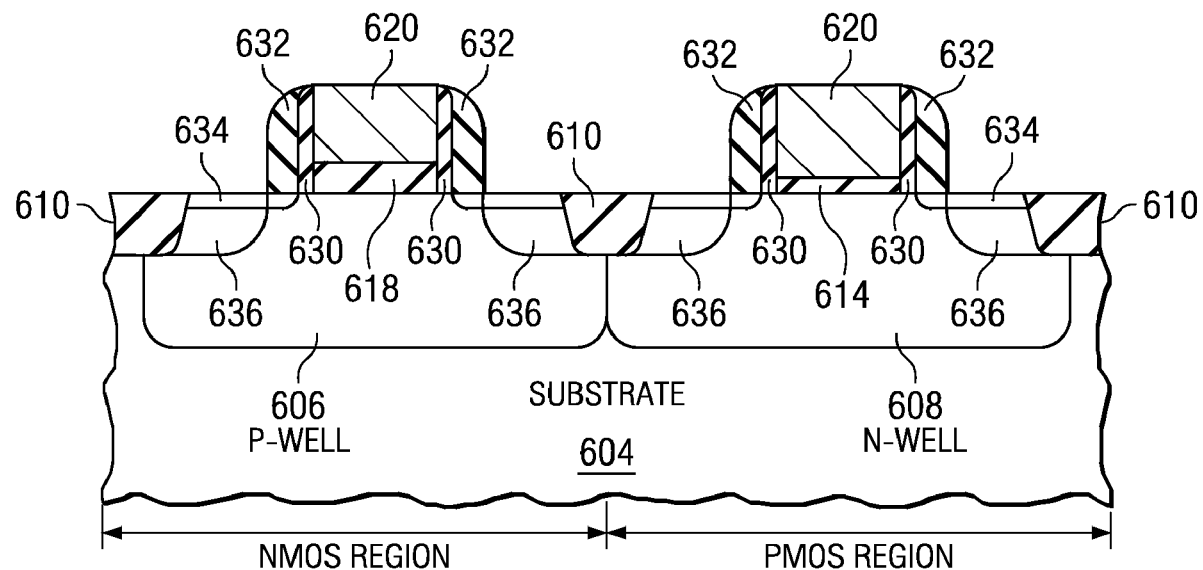
Figure 6V:
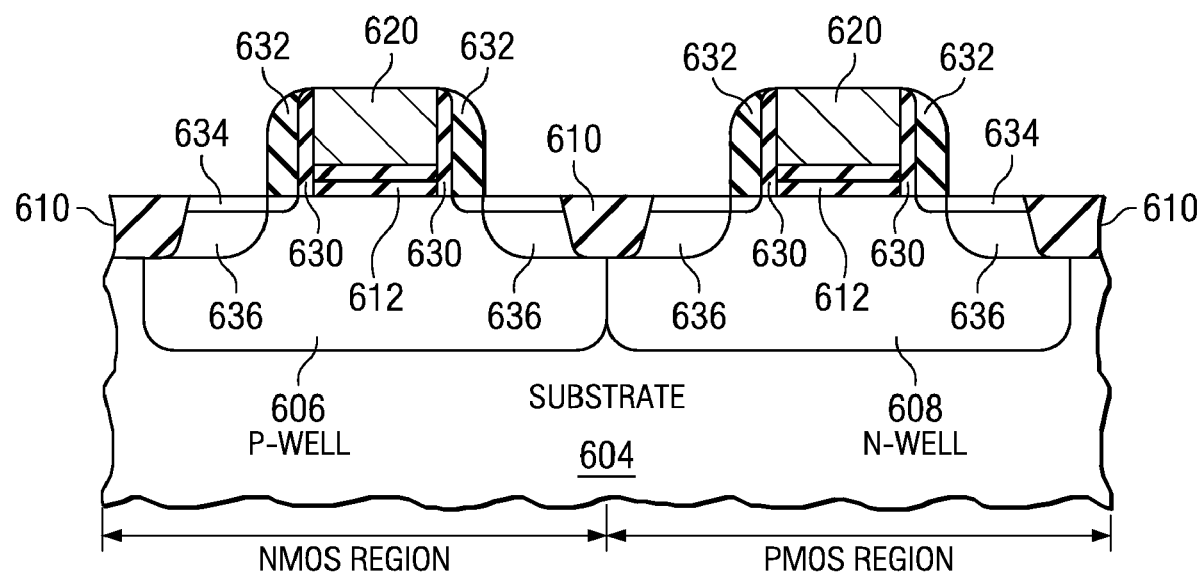

Turning now to FIGS. 6A-6V, a plurality of fragmentary cross section diagrams illustrating a transistor device having core and I/O regions and being formed in accordance with the present invention by the method 500 of FIG. 5 is provided. In FIGS. 6A and 6B, a transistor device is provided, wherein a semiconductor body 604, such as a semiconductor substrate, has a number of wells formed therein, such as a P-well region 606 to define an NMOS transistor device region and an N-well region 608 to define a PMOS transistor device region, respectively. A core region 602 is illustrated in FIG. 6A and an I/O region 603 is illustrated in FIG. 6B. Furthermore, isolation regions 610 such as STI regions are formed in the semiconductor body to define active area regions 611, as may be appreciated.

In FIGS. 6C and 6D, the transistor device is illustrated, wherein an I/O dielectric layer 612 has been formed over the device. The I/O dielectric layer 612 is typically grown to a suitable thickness, which is a function of operational characteristics for transistor devices within the I/O region 603. FIGS. 6E and 6F depict removal of the I/O dielectric layer 612 from the core region 602. As a result, the I/O dielectric layer 612 is now only present within the I/O region 603. The I/O dielectric layer 612 is comprised of a dielectric material, such as silicon dioxide and/or silicon oxynitride.

A core dielectric layer 614 is formed within the core region by a suitable growth process as shown in FIG. 6G. During this growth process, the I/O dielectric layer region 612 within the I/O region, shown in FIG. 6H, also grows. The core dielectric layer 614 is comprised of a dielectric material, such as silicon dioxide and/or silicon oxynitride.

A barrier layer 616 is formed on the core and I/O dielectric layers and patterned to expose the NMOS region of the core region and cover the other regions of the device as shown in FIGS. 6I and 6J. The barrier layer 616 can protect the $SiO_2$ or SiON layers from later fabrication processes and is comprised of a suitable material, such as polysilicon, SiGe, Ge, silicon nitride ($Si_3N_4$), silicon carbide (SiC) or carbon-doped $SiO_2$ (SiOC), and also mitigates formation of high-k materials within the core dielectric layer 614 and the I/O dielectric layer 612.

The core dielectric layer 614 is removed from the NMOS region of the core region by employing an etch process selective to the barrier layer as shown in FIGS. 6K and 6L. The etch process removes the core dielectric material form the NMOS region of the core region, but does not remove the core dielectric and/or I/O dielectric material because the barrier layer prevents such etching from occurring.

A high-k dielectric layer 618 is formed over the device in a blanket operation in both the core and I/O regions as shown in FIGS. 6M and 6N. The high-k dielectric layer 618 is formed on the semiconductor substrate (well region) within the NMOS region of the core region. In the other regions, the high-k dielectric layer 618 is formed on the barrier layer 616. The high-k dielectric layer 618 is formed by depositing a suitable high-k material, such as hafnium silicate (HfSiO), having a dielectric constant substantially greater than 3.9. Additionally, nitrogen (N) may be introduced during the formation of the high-k dielectric layer or can be added subsequently in a nitridation process.

The high-k dielectric layer 618 is removed from the PMOS regions of the core region and the entire I/O region as shown in FIGS. 6O and 6P. A photoresist mask that covers the NMOS region of the core region and exposes elsewhere is employed to facilitate the patterning. Subsequently, the barrier layer 616 is removed by an etch process selective to the dielectric and the high-k material as shown in FIGS. 6Q and 6R. The core dielectric layer 614, the I/O dielectric layer 612, and the high-k dielectric layer 618 are nitrided after removal of the barrier layer 616.

The core dielectric layer 614 becomes nitrided and, for example, converts from silicon dioxide to silicon oxynitride as a core silicon oxynitride layer 614. Similarly, the I/O dielectric layer 612 becomes nitrided and transforms from silicon dioxide to silicon oxynitride as an I/O silicon oxynitride layer 612.

Dielectric characteristics of NMOS devices within the core region are a function of the composition and thickness of the high-k dielectric layer 618. Dielectric characteristics of PMOS devices within the core region are a function of the thickness of the core silicon oxynitride (nitrided) layer 614. Dielectric characteristics of NMOS and PMOS devices within the I/O region are a function of the composition and thickness of the I/O silicon oxynitride layer 612.

Subsequently, conductive gate electrode material is deposited over the device and patterned as shown in FIGS. 6S and 6T to form a gate electrode layer 620 in both the core and I/O regions. The gate electrode material is a conductive material such as polysilicon, metal or metal compound. If polysilicon is employed, it can be doped or undoped.

FIG. 6U depicts the core region 602 of the device after formation of source/drain regions 636 and FIG. 6V depicts the I/O region 603 of the device after formation of the source/drain regions 636. After formation of the gate electrode layer 622, the layers are patterned to form gate structures, as described above. Then, offset spacers 630 are formed on lateral edges of the gate structures. The offset spacers serve to align an extension region implant that forms extension regions 634. Afterward, sidewall spacers 632 are formed on the lateral edges of the gate structures adjacent to the offset spacers 630. Continuing, the source/drain regions 636 are formed within the NMOS and PMOS regions by implanting n-type and p-type dopants, respectively.

It is noted that the semiconductor device depicted in FIGS. 6A to 6V is exemplary in nature and intended to facilitate an understanding of the present invention. It is appreciated that variations in thicknesses, layers formed, dimensions, materials employed, and the like are permitted and contemplated in accordance with the present invention.

Figure 7:
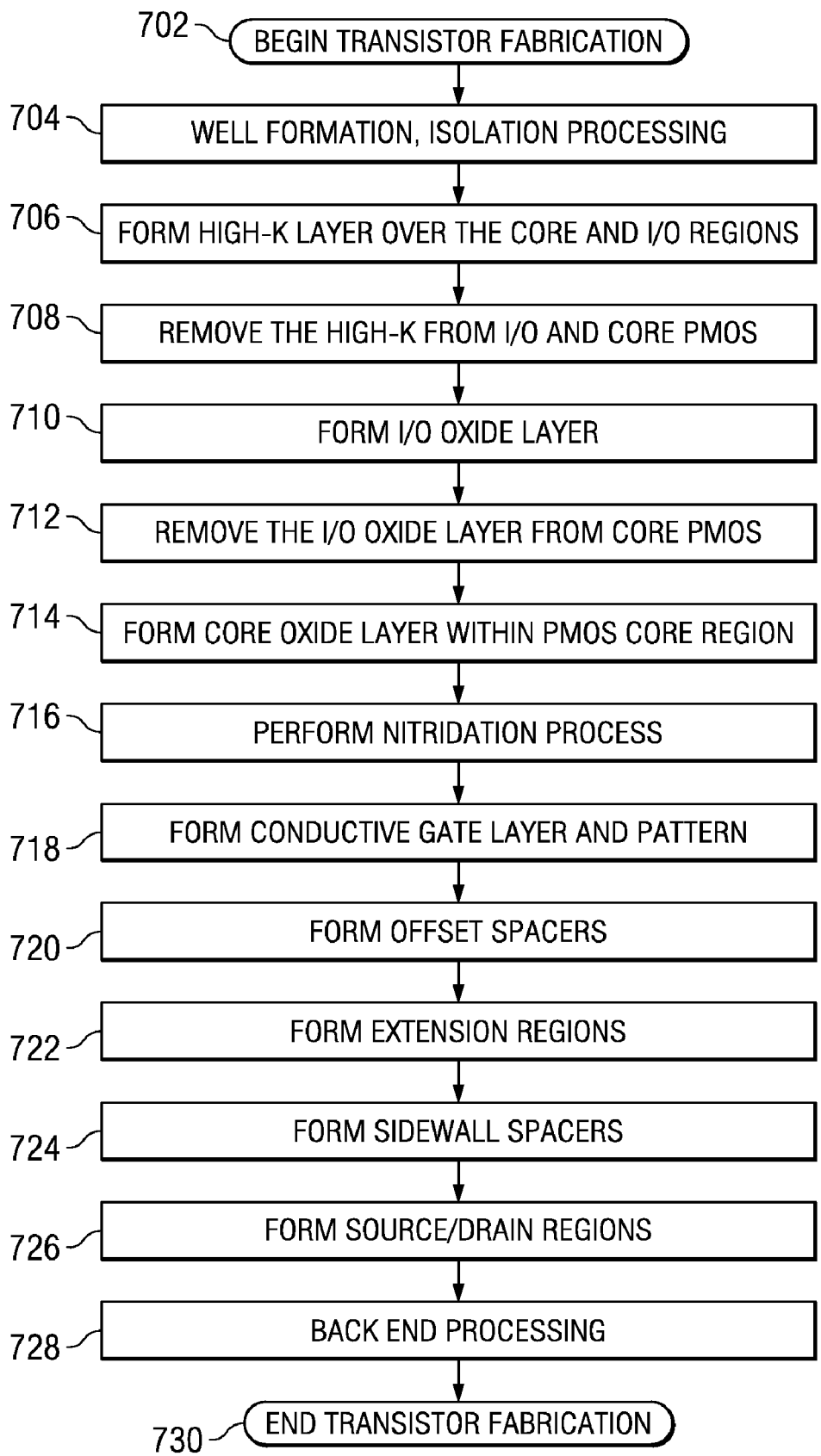
FIG. 7 is a flow diagram illustrating a method of fabricating a CMOS semiconductor device having a core region and an I/O region that forms a high-k dielectric layer prior to forming other dielectric layers in accordance with an aspect of the present invention.

FIG. 7 is a flow diagram illustrating a method 700 of fabricating a CMOS semiconductor device having a core region and an I/O region. The method 700 selectively employs high-k dielectric materials for dielectric layers of NMOS devices within the core, but employs silicon oxynitride for dielectric layers of PMOS devices within the I/O and the core and NMOS devices within the I/O thereby mitigating or avoiding problems resulting from employing high-k dielectrics with PMOS devices. Unlike the method 500 of FIG. 5, the method 700 forms a high-k layer prior to forming other dielectric layers to prevent or mitigate damage to the other dielectric layers during formation and patterning of the high-k dielectric layer.

While the exemplary method 700 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 700 begins at block 702, wherein transistor fabrication is initiated, and transistor well formation and isolation processing is performed at block 704 thereby defining NMOS and PMOS regions within core and I/O regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 700 continues at block 706, wherein a high-k dielectric layer is formed over the entire device in a blanket operation. The high-k layer by depositing high-k material (e.g., HfSiO, HfSiON, and the like) in both the core and I/O regions and is formed with a relatively high concentration of silicon dioxide, such as $\geq 50\%$ $SiO_2$ on a silicon to hafnium basis, and/or a relatively high concentration of nitrogen, such as $\geq 10$ atomic %.

The concentration of silicon dioxide is chosen to mitigate crystallization and phase separation of the high-k material during subsequent fabrication processes, particularly subsequent dielectric formation processes. Additionally, the high-k dielectric layer may comprise nitrogen so as to further mitigate damage and/or crystallization to the high-k dielectric layer during later dielectric formation processes.

The deposition process is performed so as to result in a thickness associated with a desired or selected equivalent oxide thickness (EOT). As stated above, high-k dielectric materials have dielectric constants that are greater than that of silicon dioxide (e.g., substantially greater than about 3.9). As a result, the high-k dielectric layer can be formed in a thicker layer than scaled silicon dioxide, and yet produce equivalent field effect performance. The relative electrical performance of such high-k dielectric materials is often expressed as EOT, because the high-k material layer may be thicker, while still providing the equivalent electrical effect of a much thinner layer of silicon dioxide. Since the dielectric constant "k" is higher than silicon dioxide, a thicker high-k dielectric layer can be employed to mitigate tunneling leakage currents, while still achieving the equivalent electrical performance of a thinner layer of thermally grown silicon dioxide.

At block 708, the high-k dielectric layer is patterned and removed from the PMOS region of the core region and NMOS and PMOS regions of the I/O region. As a result, the high-k dielectric layer remains only within the NMOS region of the core region.

An I/O dielectric layer is formed within the PMOS region of the core region and the entire I/O region by, for example, a silicon dioxide formation process at block 710. The I/O dielectric layer is comprised of a dielectric material such as silicon dioxide and/or silicon oxynitride. A suitable silicon dioxide formation process mitigates crystallization of the high-k dielectric layer by, for example, employing lower temperatures. For example, low temperature growth processes can be employed or low temperature plasma processes can be employed that are less than the temperature of typical silicon dioxide growth processes (about 1,000 degrees Celsius).

Subsequently, the I/O dielectric layer is removed from the PMOS core region at block 712. A pattern and etch process is employed that removes the I/O dielectric material from the PMOS core region, but does not remove the I/O dielectric material from the NMOS and PMOS regions of the I/O region or the high-k dielectric from the NMOS core region.

A core dielectric layer is then formed within the PMOS region of the core region at block 714, typically by, for example, growing silicon dioxide. The core dielectric layer is comprised of a dielectric material such as silicon dioxide and/or silicon oxynitride. The core dielectric layer is thinner than the I/O dielectric layer to accommodate lower operating voltages and to facilitate faster device operation. It is noted that silicon dioxide does not substantially grow under the high-k dielectric layer.

A nitridation process is performed at block 716 that adds nitrogen to the high-k dielectric layer, the core dielectric layer, and the I/O dielectric layer. The core dielectric layer becomes nitrided and, for example, converts from silicon dioxide to silicon oxynitride as a core silicon oxynitride layer. Similarly, the I/O dielectric layer becomes nitrided and transforms, for example, from silicon dioxide to silicon oxynitride as an I/O silicon oxynitride layer.

Dielectric characteristics of NMOS devices within the core region are a function of the composition and thickness of the high-k dielectric layer. Dielectric characteristics of PMOS devices within the core region are a function of the thickness of the core dielectric layer (silicon oxynitride (nitrided) layer). Dielectric characteristics of NMOS and PMOS devices within the I/O region are a function of the composition and thickness of the I/O dielectric layer (silicon oxynitride layer).

A conductive gate electrode layer is then deposited over the device at block 718 and patterned to form a conductive gate electrodes in PMOS and NMOS regions of the core and I/O regions. The gate electrode layer comprises a conductive material such as polysilicon, metal or metal compound. As an example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at block 720. For example, a thin offset layer (e.g., an silicon dioxide or silicon nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at block 722 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 7, sidewall spacers are then formed on the gate structures at block 724. The sidewall spacers comprise an insulating material such as a silicon dioxide, a silicon nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS and PMOS regions of the core and I/O regions at block 726. Source/drain regions are formed within the NMOS regions by masking the PMOS regions with a resist mask, exposing the NMOS regions, and implanting n-type dopants (e.g., phosphorous). Similarly, source/drain regions are formed within the PMOS regions by masking the NMOS regions with a resist mask, exposing the PMOS regions, and implanting p-type dopants (e.g., boron). The source/drain dopants are introduced into the exposed areas (top of gate electrode and active areas not covered by the sidewall spacers).

Subsequently, other features and/or components of the device can be formed at block 728 ending fabrication at block 730. Conductive contacts can be formed through a PMD layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material.

Turning now to FIGS. 8A to 8L, a plurality of fragmentary cross section diagrams illustrating a transistor device having core and I/O regions and being formed in accordance with the present invention by the method 700 of FIG. 7 is provided. The cross sections depict formation and patterning of a high-k layer that is formed before the I/O dielectrics and PMOS core dielectric.

Figure 8A:
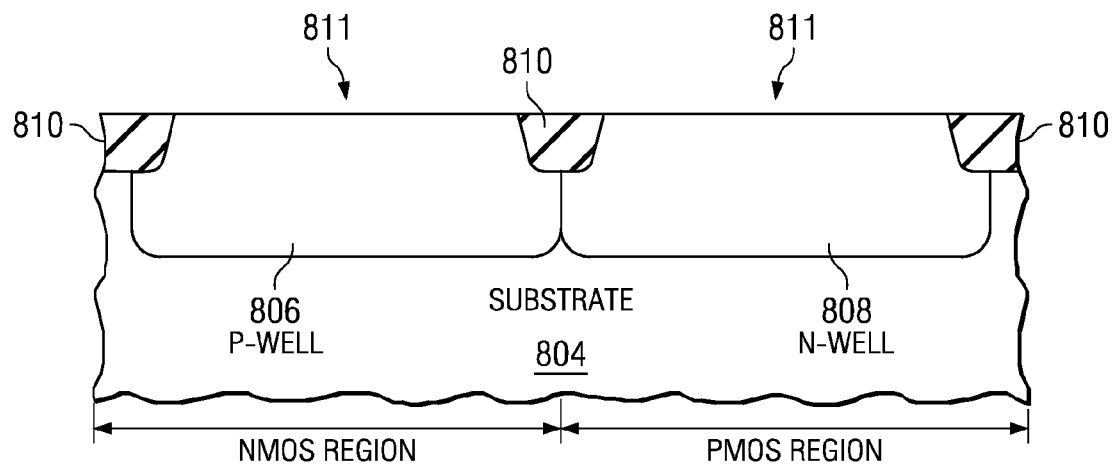
FIGS. 8A to 8L are a plurality of fragmentary cross section diagrams illustrating a transistor device having core and I/O regions and being formed in accordance with the present invention by the method of FIG. 7.
Figure 8B:
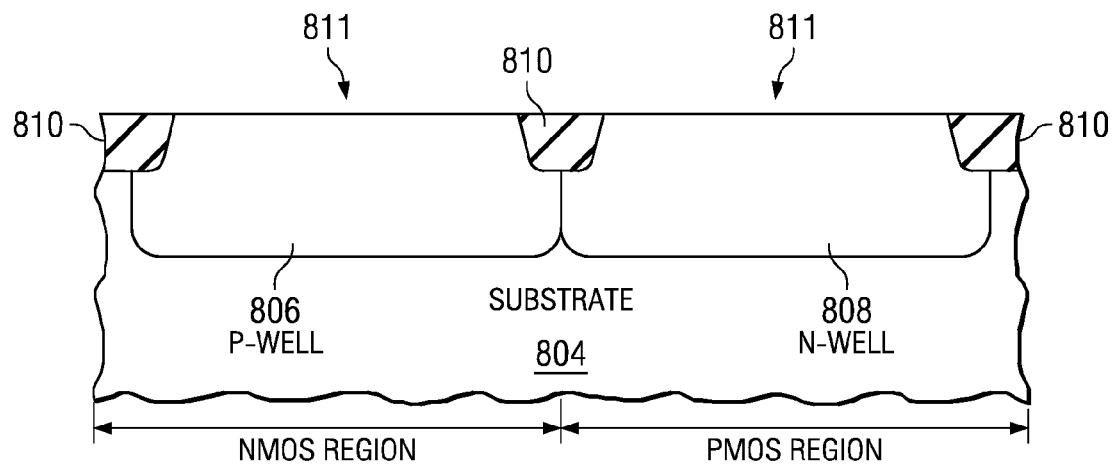

In FIGS. 8A and 8B, a transistor device is provided, wherein a semiconductor body 804, such as a semiconductor substrate, has a number of wells formed therein, such as a P-well region 806 to define an NMOS transistor device region and an N-well region 808 to define a PMOS transistor device region, respectively. A core region 802 is illustrated in FIG. 8A and an I/O region 803 is illustrated in FIG. 8B. Furthermore, isolation regions 810 such as STI regions are formed in the semiconductor body to define active area regions 811, as may be appreciated.

Figure 8C:
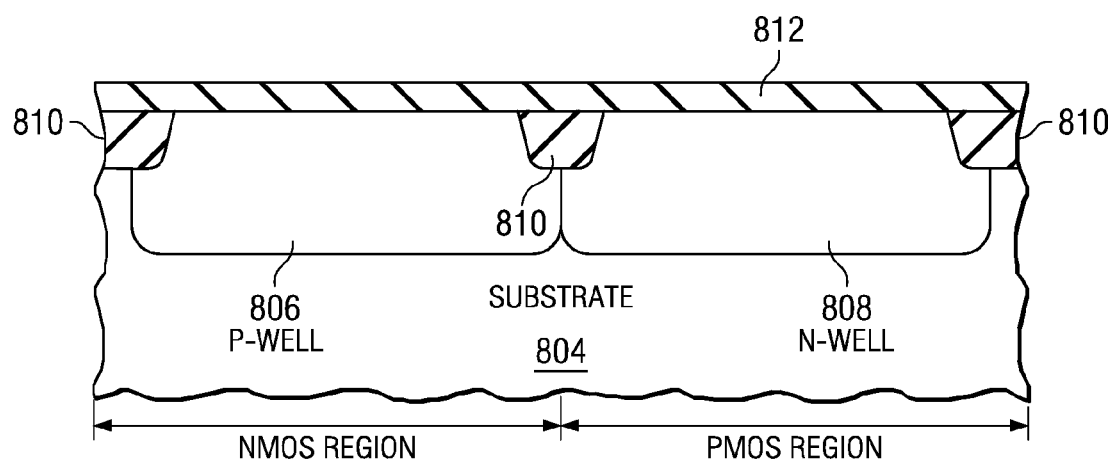
Figure 8D:
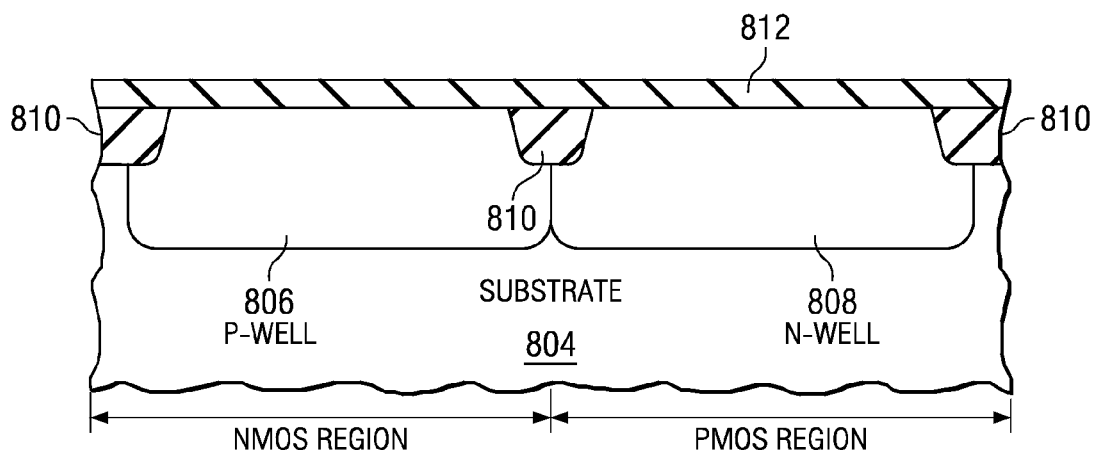

A high-k dielectric layer 812 is formed over the device in both core 802 and I/O 803 regions as shown in FIGS. 8C and 8D. The high-k dielectric layer 812 is formed to a thickness dependent upon operational parameters of NMOS devices within the NMOS region of the core region. The high-k dielectric layer 812 is comprised of a suitable material, such as HfSiON.

Figure 8E:
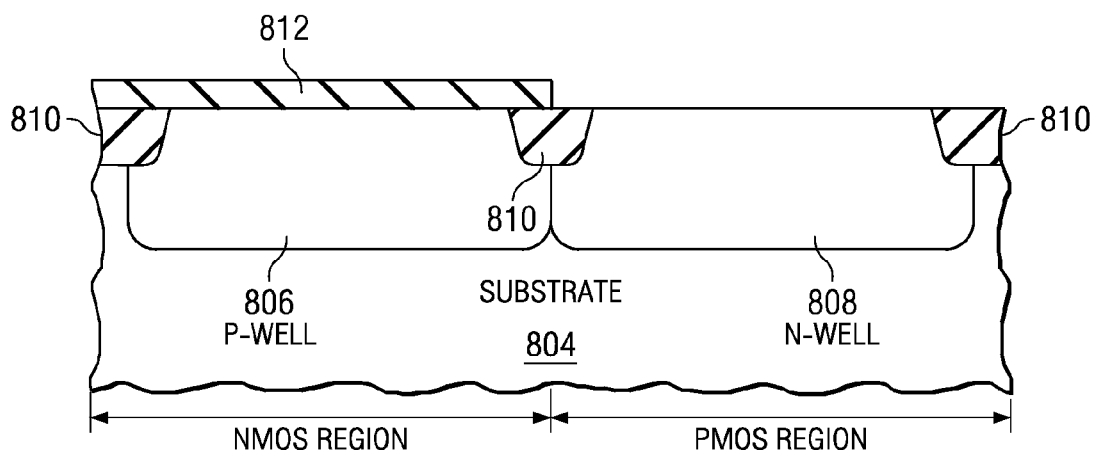
Figure 8F:
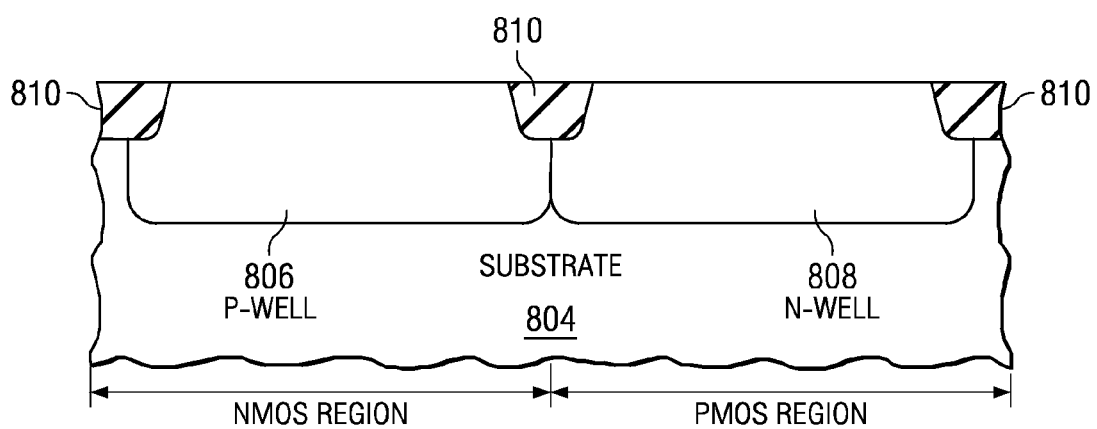

FIGS. 8E and 8F depict the device after the high-k dielectric layer 812 is removed from the I/O region 803 and from the PMOS region of the core region 802. An etch process selective to the semiconductor substrate or body 804 is employed.

Figure 8G:
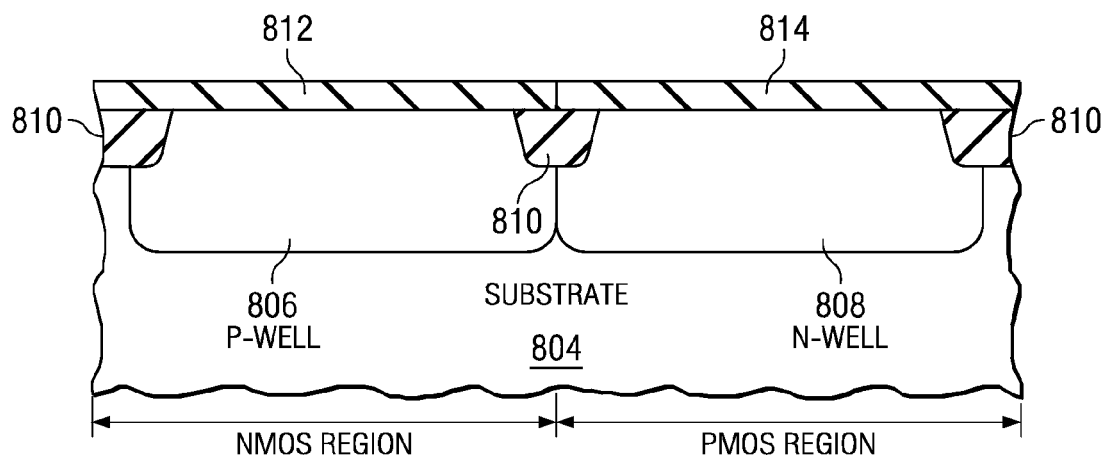
Figure 8H:
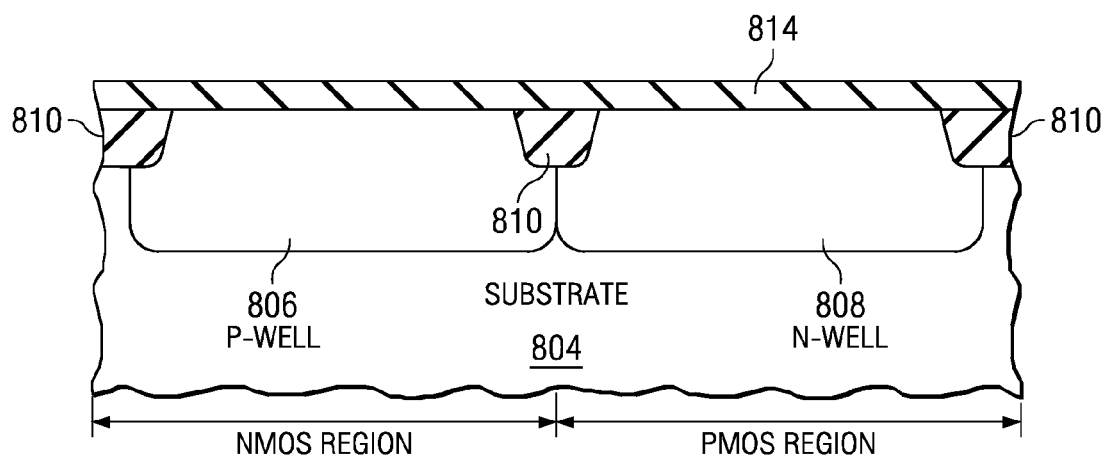
Figure 8I:
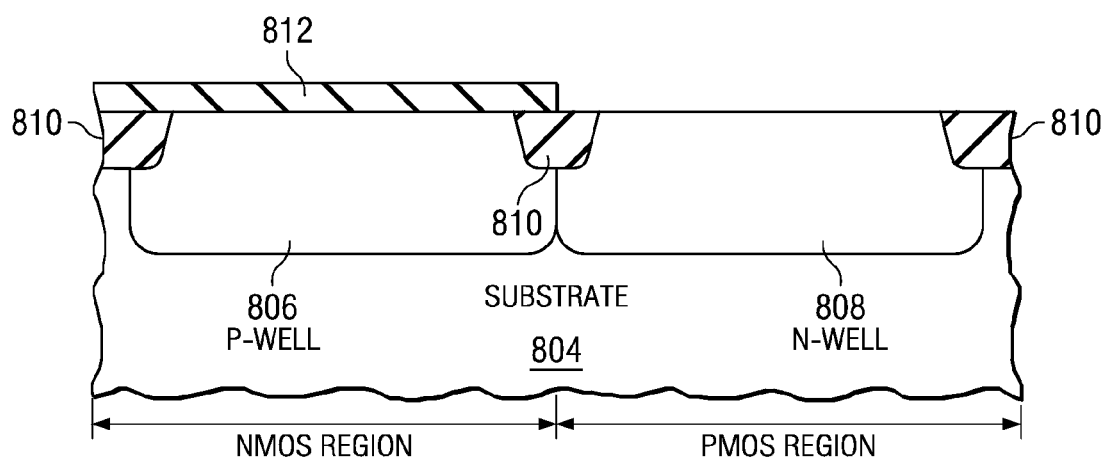
Figure 8J:
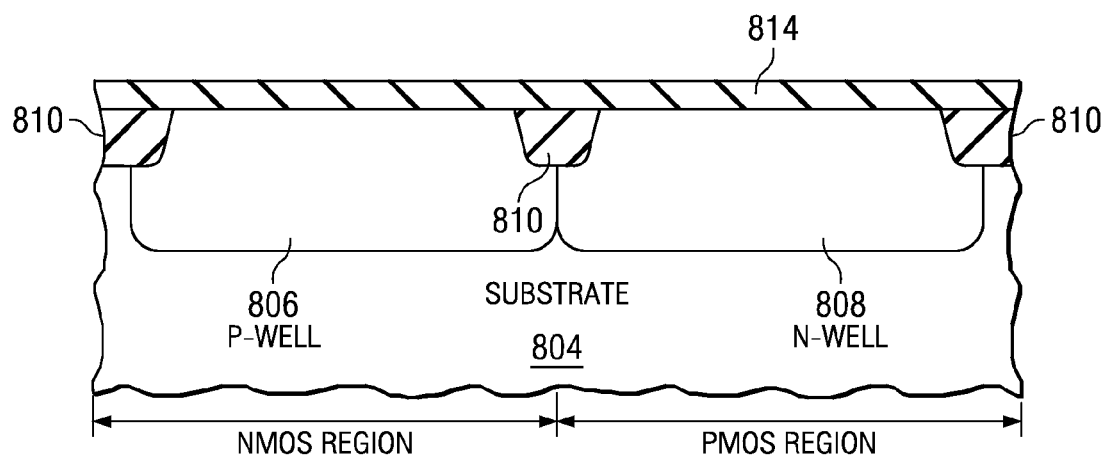

An I/O dielectric layer 814 is formed in the PMOS region of the core region 802 and the PMOS and NMOS regions of the I/O region 803 as shown in FIGS. 8G and 8H. Typically, a silicon dioxide growth process is employed to form the I/O dielectric layer. The thickness of the I/O dielectric layer 814 is dependent upon operational characteristics, such as threshold voltage, of transistor devices within the I/O region 803. The I/O dielectric layer 814 is subsequently removed from the PMOS region of the core region 802 but remains within the I/O region 803 as indicated in FIGS. 8I and 8J.

Figure 8K:
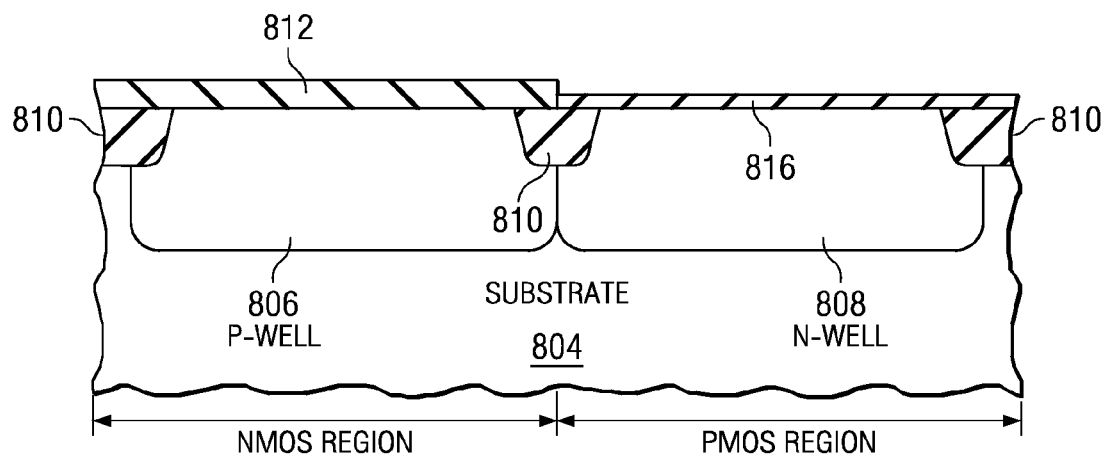
Figure 8L:
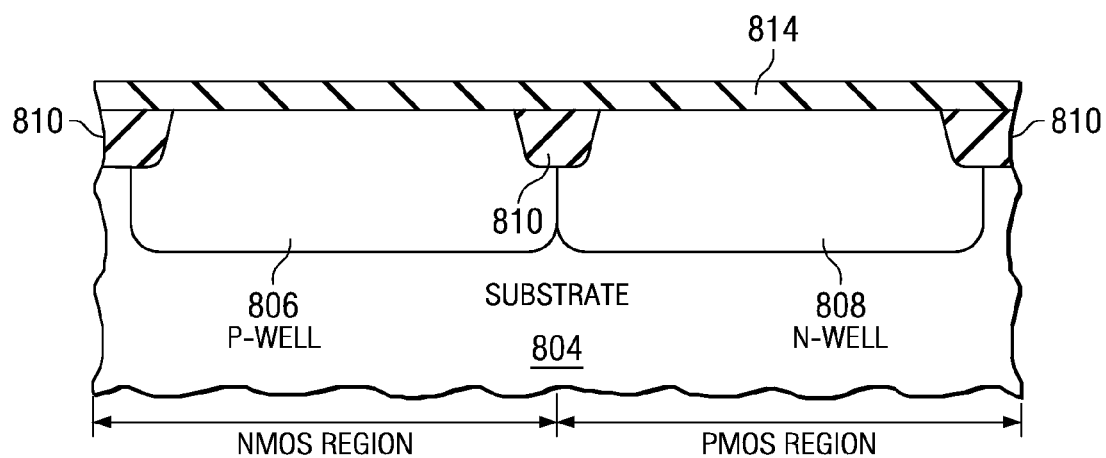

A core dielectric layer 816 is then formed within the PMOS region of the core region 802 as shown in FIGS. 8K and 8L. The core dielectric layer 816 is formed on the n-well region 808 to a thickness according to operational characteristics of PMOS transistor devices within the PMOS region of the core region 802. Generally, a thermal silicon dioxide growth process is employed. The substrate silicon underneath the high-k dielectric layer 812 does not substantially grow by the silicon dioxide formation process.

FIGS. 6A-6V can be referenced for additional description of the structure as gate electrodes, sidewall spacers, source/drain regions, and the like are formed. It is noted that the semiconductor device depicted in FIGS. 8A to 8L is exemplary in nature and intended to facilitate an understanding of the present invention. It is appreciated that variations in thicknesses, layers formed, dimensions, materials employed, and the like are permitted and contemplated in accordance with the present invention.

Figure 9:
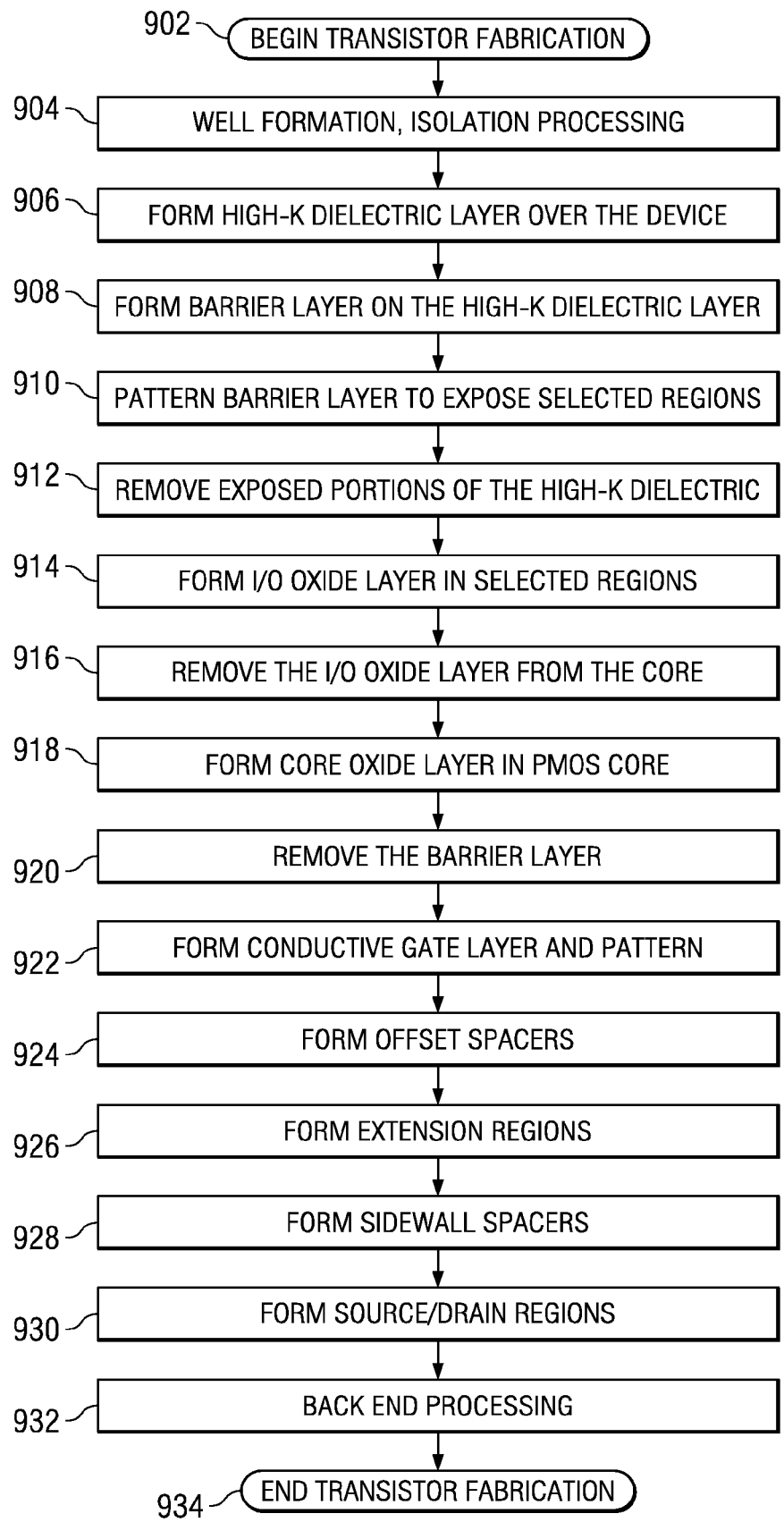
FIG. 9 is a flow diagram illustrating a method of fabricating a CMOS semiconductor device having a core region and an I/O region that forms a high-k dielectric layer prior to forming other dielectric layers and employs a barrier layer in accordance with an aspect of the present invention.

FIG. 9 is a flow diagram illustrating a method 900 of fabricating a CMOS semiconductor device having a core region and an I/O region. The method 900 selectively employs high-k dielectric materials for dielectric layers of NMOS devices within the core, but employs silicon oxynitride for dielectric layers of PMOS devices within the I/O and the core and NMOS devices within the I/O thereby mitigating or avoiding problems resulting from employing high-k dielectrics with PMOS devices. Similar to the method 700 of FIG. 7, the method 900 forms a high-k layer prior to forming other dielectric layers to prevent or mitigate damage to the other dielectric layers during formation of the high-k dielectric layer. However, the method 900 employs a barrier layer to provide additional protection and mitigate damage to the high-k dielectric layer.

While the exemplary method 900 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 900 begins at block 902, wherein transistor fabrication is initiated, and transistor well formation and isolation processing is performed at block 904 thereby defining NMOS and PMOS regions within core and I/O regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 900 continues at block 906, wherein a high-k dielectric layer is formed over the entire device in a blanket operation. The high-k layer by depositing high-k material (e.g., HfSiO, HfSiON, and the like) in both the core and I/O regions and is formed with a relatively high concentration of silicon dioxide. The concentration of silicon dioxide is chosen to mitigate crystallization and phase separation of the high-k material during subsequent fabrication processes, particularly subsequent dielectric formation processes. Additionally, the high-k dielectric layer may comprise nitrogen so as to further mitigate damage and/or crystallization to the high-k dielectric layer during later dielectric formation processes.

The deposition process is performed so as to result in a thickness associated with a desired or selected equivalent oxide thickness (EOT). As stated above, high-k dielectric materials have dielectric constants that are greater than that of silicon dioxide (e.g., substantially greater than about 3.9). As a result, the high-k dielectric layer can be formed in a thicker layer than scaled dielectric, and yet produce equivalent field effect performance. The relative electrical performance of such high-k dielectric materials is often expressed as EOT, because the high-k material layer may be thicker, while still providing the equivalent electrical effect of a much thinner layer of silicon dioxide. Since the dielectric constant "k" is higher than silicon dioxide, a thicker high-k dielectric layer can be employed to mitigate tunneling leakage currents, while still achieving the equivalent electrical performance of a thinner layer of thermally grown silicon dioxide.

At block 908, a barrier layer is formed over the device on the high-k dielectric layer. The barrier layer is comprised of a material, such as polysilicon, SiGe, Ge, silicon nitride ($Si_3N_4$), silicon carbide (SiC) or carbon-doped $SiO_2$ (SiOC), that mitigates damage and/or contamination to the high-k dielectric layer.

The barrier layer is patterned at block 910 to expose the PMOS region of the core region and both the PMOS and NMOS regions of the I/O region while covering the NMOS region of the core region. Generally, a resist mask and etch process selective to the high-k dielectric material is employed.

At block 912, the high-k dielectric layer is patterned and removed from the PMOS region of the core region and both regions of the I/O region using the barrier layer as a mask. As a result, the high-k dielectric layer remains only within the NMOS region of the core region.

An I/O dielectric layer is formed within the PMOS region of the core region and the entire I/O region at block 914 by, for example, a silicon dioxide formation process. A suitable silicon dioxide formation process mitigates crystallization of the high-k dielectric layer by, for example, employing lower temperatures. For example, low temperature growth processes can be employed or low temperature plasma processes can be employed that are less than the temperature of typical silicon dioxide growth processes (about 1,000 degrees C.). The I/O dielectric layer can optionally comprise silicon oxynitride instead of silicon dioxide.

Subsequently, the I/O dielectric layer is removed from the PMOS core region at block 916. A pattern and etch process is employed removes the I/O dielectric material form the PMOS core region, but does not remove the I/O dielectric material from the NMOS and PMOS regions of the I/O region or the high-k dielectric from the NMOS core region.

A core dielectric layer is then formed within the PMOS region of the core region at block 918, typically by, for example, growing silicon dioxide. The core dielectric layer is thinner than the I/O dielectric layer to accommodate lower operating voltages and to facilitate faster device operation. It is noted that silicon dioxide does not substantially grow under the high-k dielectric layer. The core dielectric layer can optionally comprise silicon oxynitride instead of silicon dioxide.

The barrier layer is removed at block 920 by a suitable stripping process, such as one employing phosphoric acid when a $Si_3N_4$ barrier is used. The stripping process does not substantially remove the core dielectric layer, the I/O dielectric layer, and/or the high-k dielectric layer. Subsequently, a nitridation process is performed that adds nitrogen to the high-k dielectric layer, the core dielectric layer, and the I/O dielectric layer. The core dielectric layer becomes nitrided and converts from silicon dioxide to silicon oxynitride as a core silicon oxynitride layer. Similarly, the I/O dielectric layer becomes nitrided and transforms from silicon dioxide to silicon oxynitride as an I/O silicon oxynitride layer.

Dielectric characteristics of NMOS devices within the core region are a function of the composition and thickness of the high-k dielectric layer. Dielectric characteristics of PMOS devices within the core region are a function of the thickness of the core dielectric layer (silicon oxynitride (nitrided) layer). Dielectric characteristics of NMOS and PMOS devices within the I/O region are a function of the composition and thickness of the I/O dielectric layer.

A conductive gate electrode layer is then deposited over the device at block 922 and patterned to form a conductive gate electrodes in PMOS and NMOS regions of the core and I/O regions. The gate electrode layer comprises a conductive material such as polysilicon, metal or metal compound. As an example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at block 924. For example, a thin offset layer (e.g., an silicon dioxide or silicon nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at block 926 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 9, sidewall spacers are then formed on the gate structures at block 928. The sidewall spacers comprise an insulating material such as an silicon dioxide, a silicon nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS and PMOS regions of the core and I/O regions at block 930. Source/drain regions are formed within the NMOS regions by masking the PMOS regions with a resist mask, exposing the NMOS regions, and implanting n-type dopants (e.g., phosphorous). Similarly, source/drain regions are formed within the PMOS regions by masking the NMOS regions with a resist mask, exposing the PMOS regions, and implanting p-type dopants (e.g., boron). The source/drain dopant is introduced into the exposed areas (top of gate electrode and active areas not covered by the sidewall spacers).

Subsequently, other features and/or components of the device, such as interlevel insulative layers, contacts, and the like, can be formed at block 932 ending fabrication at block 934.

Turning now to FIGS. 10A to 10F, a plurality of fragmentary cross section diagrams illustrating a transistor device having core and I/O regions and being formed in accordance with the present invention by the method 900 of FIG. 9 is provided. The cross sections depict formation and patterning of a barrier layer that protects a formed high-k dielectric layer.

Figure 10A:
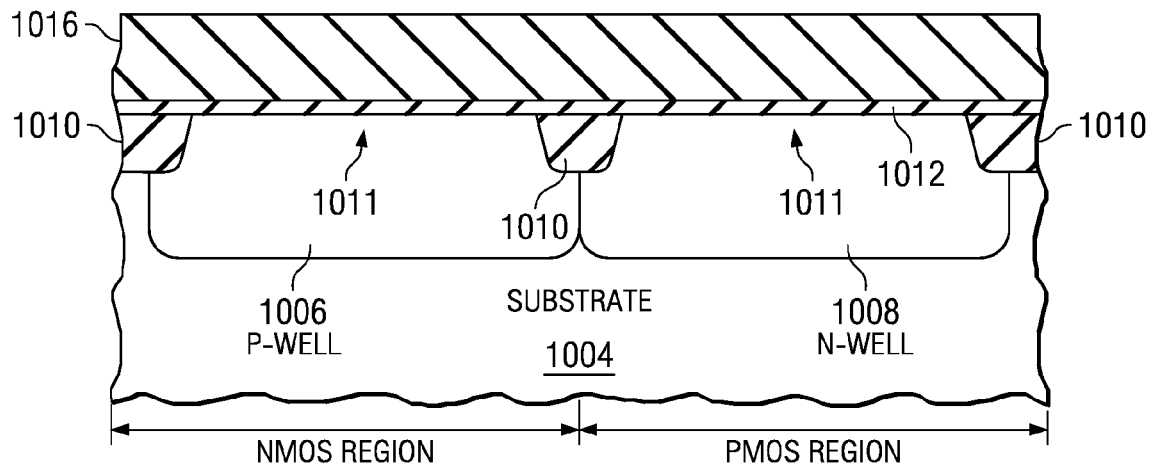
FIGS. 10A to 10F are a plurality of fragmentary cross section diagrams illustrating a transistor device having core and I/O regions and being formed in accordance with the present invention by the method of FIG. 9.
Figure 10B:
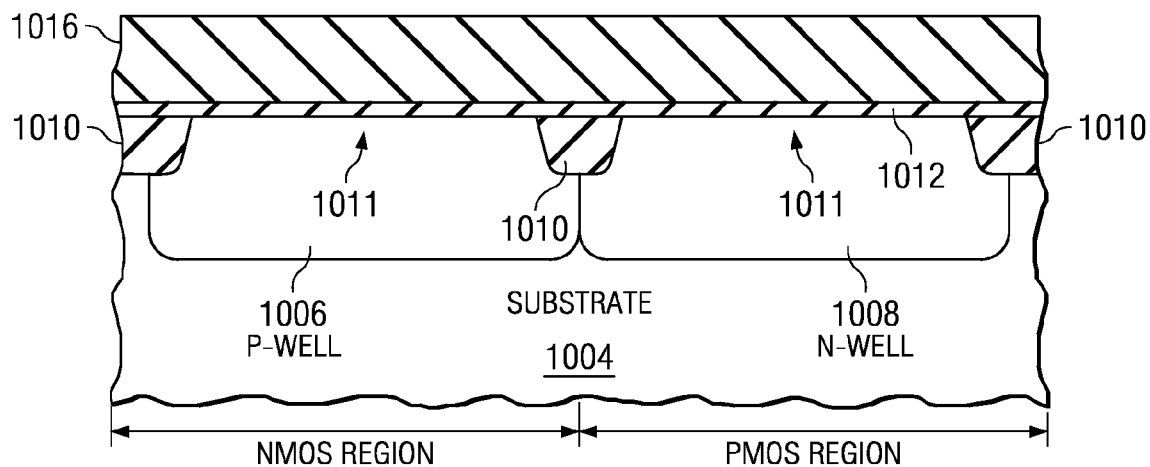

In FIGS. 10A and 10B, a transistor device is provided, wherein a semiconductor body 1004, such as a semiconductor substrate, has a number of wells formed therein, such as a P-well region 1006 to define an NMOS transistor device region and an N-well region 1008 to define a PMOS transistor device region, respectively. A core region 1002 is illustrated in FIG. 10A and an I/O region 1003 is illustrated in FIG. 10B. Furthermore, isolation regions 1010 such as STI regions are formed in the semiconductor body to define active area regions 1011, as may be appreciated. A high-k dielectric layer 1012 is formed over the device in both core 1002 and I/O 1003 regions as shown in FIGS. 10A and 10B. The high-k dielectric layer 1012 is formed to a thickness dependent upon operational parameters of NMOS devices within the NMOS region of the core region. The high-k dielectric layer 1012 is comprised of a suitable material, such as HfSiON. A barrier layer 1016 comprised of a suitable barrier material, such as polysilicon, is formed over the device in both the core region 1002 and the I/O region 1003.

Figure 10C:
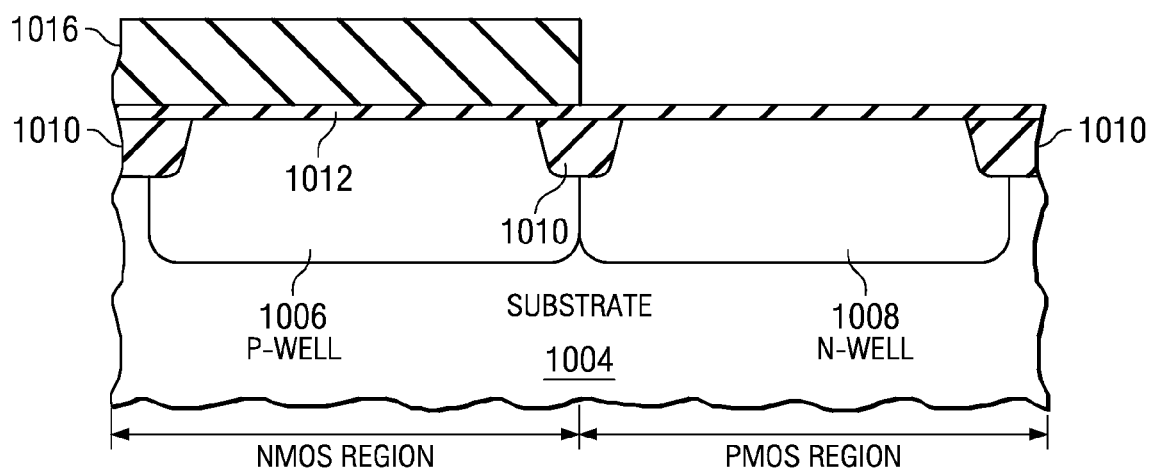
Figure 10D:
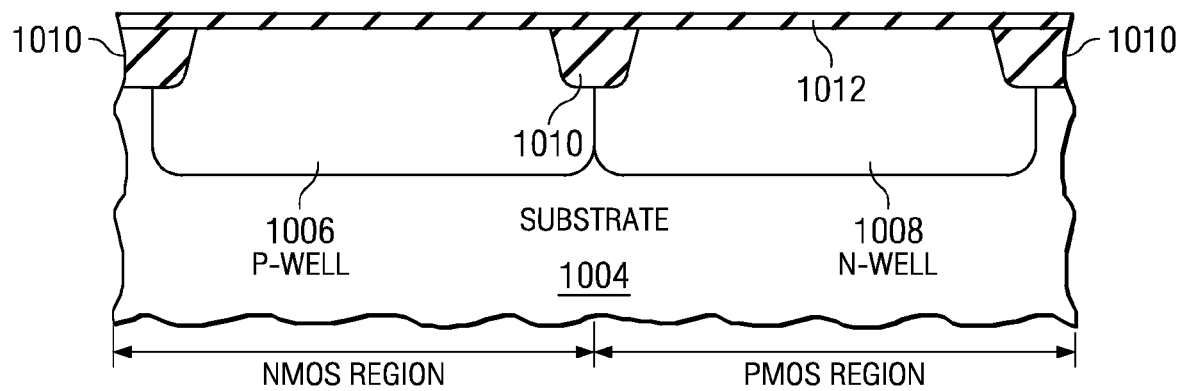
Figure 10E:
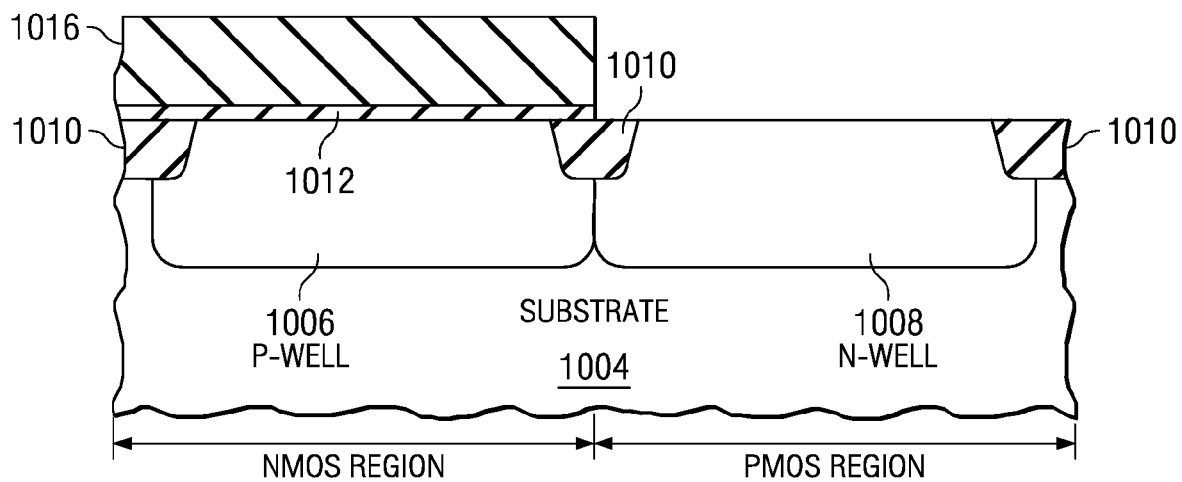
Figure 10F:
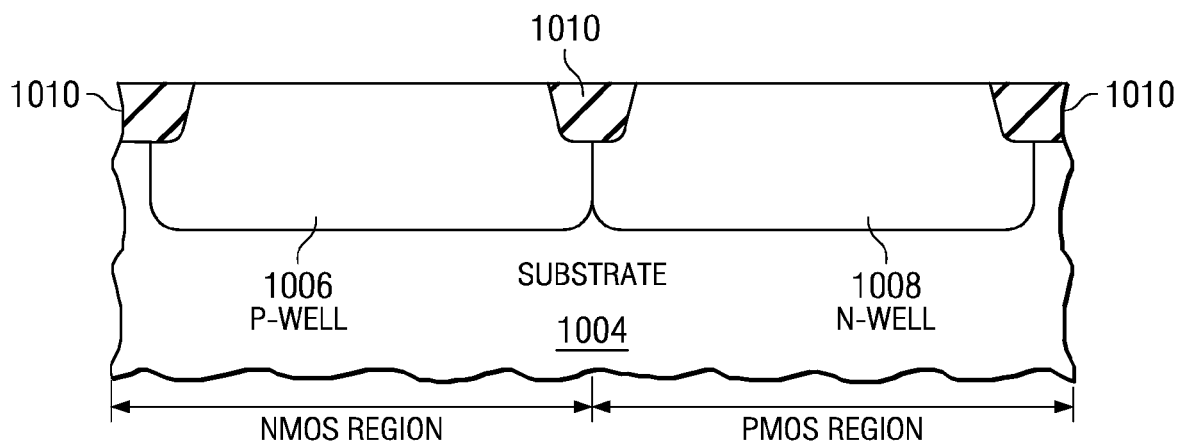

The barrier layer 1016 is patterned to cover only the NMOS region of the core region 1002. The PMOS region of the core region 1002 and the NMOS and PMOS regions of the I/O region 1003 are exposed as shown in FIGS. 10C and 10D. The barrier layer 1012 is then employed as a mask to remove the high-k dielectric layer 1012 from the PMOS region of the core region 1002 and the NMOS and PMOS regions of the I/O region 1003. As a result, the high-k layer 1012 is only present within the NMOS region of the core region 1002 as shown in FIGS. 10E and 10F.

FIGS. 6A to 6V and FIGS. 8A to 8L can be referenced for additional description of the structure as gate electrodes, sidewall spacers, source/drain regions, and the like are formed. It is noted that the semiconductor device depicted in FIGS. 10A to 10F is exemplary in nature and intended to facilitate an understanding of the present invention. It is appreciated that variations in thicknesses, layers formed, dimensions, materials employed, and the like are permitted and contemplated in accordance with the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
   forming well regions and isolation regions within a semiconductor body defining PMOS and NMOS regions of first and second regions;
   forming a high-k dielectric layer over the first and second regions;
   removing the high-k dielectric layer from the second region and the PMOS region of the first region;
   forming a first dielectric layer within the PMOS region of the first region and the second region;
   removing the first dielectric layer from the PMOS region of the first region; and
   forming a second dielectric layer in the PMOS region of the first region.

2. The method of claim 1, wherein the first region is a core region and the second region is an I/O region.

3. The method of claim 1, wherein the first dielectric layer is an I/O dielectric layer and the second dielectric layer is a core dielectric layer, wherein the core dielectric layer is thinner than the I/O dielectric layer.

4. The method of claim 1, further comprising forming a conductive gate electrode layer and patterning to form gate structures in the PMOS and NMOS regions of the first and second regions.

5. The method of claim 1, further comprising performing a nitridation process that nitrides the first dielectric layer, the second dielectric layer, and the high-k dielectric layer.

6. The method of claim 1, wherein forming the high-k dielectric layer comprises depositing HfSiON with an amount of N selected to mitigate crystallization of the high-k dielectric layer.

7. The method of claim 1, wherein forming the first dielectric layer comprises growing silicon dioxide.

8. A method of fabricating a semiconductor device comprising:
   forming well regions and isolation regions within a semiconductor body defining PMOS and NMOS regions of first and second regions;
   forming a high-k dielectric layer over the first and second regions;
   forming a barrier layer on the high-k dielectric layer;
   patterning the barrier layer to expose the PMOS and NMOS regions of the second region and the PMOS region of the first region;
   removing the exposed portions of the high-k dielectric;
   forming a first dielectric layer within the PMOS region of the first region and the second region;
   removing the first dielectric layer from the PMOS region of the first region;
   forming a second dielectric layer in the PMOS region of the first region; and
   removing the barrier layer.

9. The method of claim 8, wherein the second region is designated for higher voltage operation than the first region.

10. The method of claim 8, wherein the barrier layer is comprised of $Si_3N_4$ and removing the barrier layer comprises stripping the barrier layer with phosphoric acid.

11. The method of claim 8, wherein forming the barrier layer comprises forming the barrier layer with a thickness selected to mitigate oxidation of the high-k dielectric layer and/or underlying silicon substrate.

12. The method of claim 8, wherein the high-k dielectric layer and the second dielectric layer have substantially equivalent oxide thicknesses.

13. The method of claim 8, further comprising forming a conductive gate electrode layer and patterning to form gate structures in the PMOS and NMOS regions of the first and second regions defining active regions between the formed gate structures, and forming source/drain regions within the active regions.

14. The method of claim 2, wherein the first dielectric layer is an I/O dielectric layer and the second dielectric layer is a core dielectric layer, wherein the core dielectric layer is thinner than the I/O dielectric layer.

15. The method of claim 5, wherein forming the high-k dielectric layer comprises depositing HfSiON with an amount of N selected to mitigate crystallization of the high-k dielectric layer.

16. The method of claim 4, further comprising performing a nitridation process that nitrides the first dielectric layer, the second dielectric layer, and the high-k dielectric layer.

17. The method of claim 16, wherein forming the high-k dielectric layer comprises depositing HfSiON with an amount of N selected to mitigate crystallization of the high-k dielectric layer.

* * * * *